(12) United States Patent
Matsumura

(10) Patent No.: US 9,570,658 B2
(45) Date of Patent: Feb. 14, 2017

(54) LIGHT EMITTING ELEMENT

(71) Applicant: NICHIA CORPORATION, Anan-shi, Tokushima (JP)

(72) Inventor: Hiroaki Matsumura, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/851,821

(22) Filed: Sep. 11, 2015

(65) Prior Publication Data

US 2016/0005928 A1    Jan. 7, 2016

Related U.S. Application Data

(62) Division of application No. 14/060,654, filed on Oct. 23, 2013, now Pat. No. 9,196,807.

(30) Foreign Application Priority Data

Oct. 24, 2012  (JP) ................................ 2012-234537
Oct. 24, 2012  (JP) ................................ 2012-234538

(51) Int. Cl.
*H01L 33/00*       (2010.01)
*H01L 33/38*       (2010.01)
(Continued)

(52) U.S. Cl.
CPC ........... *H01L 33/382* (2013.01); *H01L 33/387* (2013.01); *H01L 33/60* (2013.01); *H01L 33/62* (2013.01); *H01L 2924/0002* (2013.01)

(58) Field of Classification Search
CPC .................................................. H01L 33/382
(Continued)

(56) References Cited

U.S. PATENT DOCUMENTS 7,786,498 B2    8/2010  Choi et al.
8,766,287 B2    7/2014  Moon et al.
(Continued)

FOREIGN PATENT DOCUMENTS

JP         11-204832 A     7/1999
JP       2006-148087 A     6/2006
(Continued)

OTHER PUBLICATIONS

Extended European Search Report dated Jul. 14, 2015, issued in corresponding EP patent application No. 13190118.3. (per MPEP 609. Submitted in parent U.S. Appl. No. 14/060,654).
(Continued)

*Primary Examiner* — Matthew Landau
*Assistant Examiner* — Igwe U Anya
(74) *Attorney, Agent, or Firm* — Squire Patton Boggs (US) LLP

(57) ABSTRACT

To provide a semiconductor light emitting element with high luminous efficiency, the light emitting element includes: a substrate; a semiconductor laminate placed above the substrate, the semiconductor laminate comprising a second semiconductor layer, an active layer and a first semiconductor layer laminated in this order from the substrate; and a first electrode and a second electrode placed between the substrate and the semiconductor laminate, wherein the semiconductor laminate is divided in a plurality of semiconductor blocks by a groove, wherein the first electrode includes protrusions that are provided in each of the plurality of semiconductor blocks and that penetrate the second semiconductor layer and the active layer to be connected to the first semiconductor layer, and wherein the second electrode is connected to the second semiconductor layer in each of the plurality of semiconductor blocks and has an external connector that is exposed on the bottom of the groove.

27 Claims, 28 Drawing Sheets

(51) Int. Cl.
    *H01L 33/60* (2010.01)
    *H01L 33/62* (2010.01)
(58) Field of Classification Search
    USPC .......................................................... 257/98
    See application file for complete search history.

(56) References Cited

U.S. PATENT DOCUMENTS

| | | |
|---|---|---|
| 2006/0124954 A1 | 6/2006 | Akaishi |
| 2008/0191215 A1 | 8/2008 | Choi et al. |
| 2009/0101923 A1 | 4/2009 | Choi et al. |
| 2009/0309514 A1 | 12/2009 | Kim |
| 2010/0096652 A1 | 4/2010 | Choi et al. |
| 2010/0193829 A1* | 8/2010 | Choi ................. H01L 33/20 257/99 |
| 2010/0327312 A1 | 12/2010 | Uemura et al. |
| 2011/0156064 A1* | 6/2011 | Seo .................. H01L 25/0753 257/88 |
| 2011/0186892 A1 | 8/2011 | Jeong |
| 2011/0284894 A1 | 11/2011 | Beom et al. |
| 2012/0007101 A1 | 1/2012 | Yang et al. |
| 2012/0018764 A1* | 1/2012 | Choi ................. H01L 33/08 257/99 |
| 2012/0032218 A1* | 2/2012 | Choi ................. H01L 33/08 257/98 |
| 2012/0205711 A1 | 8/2012 | Jeong |
| 2012/0235168 A1 | 9/2012 | Katsuno et al. |
| 2013/0062638 A1 | 3/2013 | Onushkin et al. |

FOREIGN PATENT DOCUMENTS

| | | |
|---|---|---|
| JP | 2010-171443 A | 8/2010 |
| JP | 2011-009386 A | 1/2011 |
| JP | 2011-139038 A | 7/2011 |
| JP | 2011-249805 A | 12/2011 |
| JP | 2012-019217 A | 1/2012 |

OTHER PUBLICATIONS

Japanese Office Action application No. 2012-234538 issued Mar. 8, 2016.

* cited by examiner

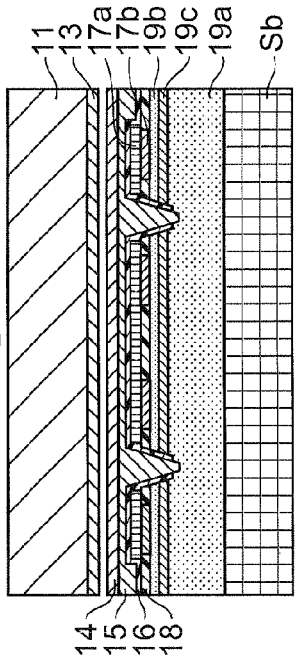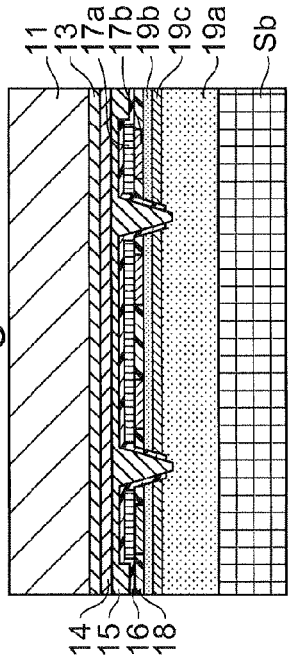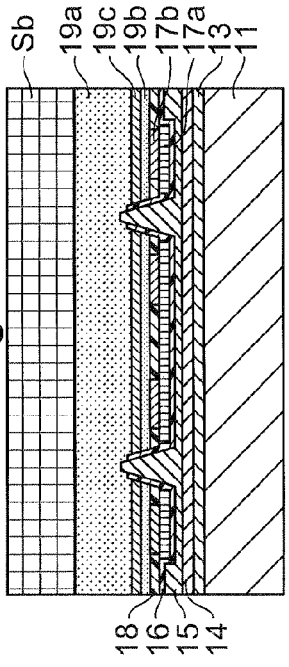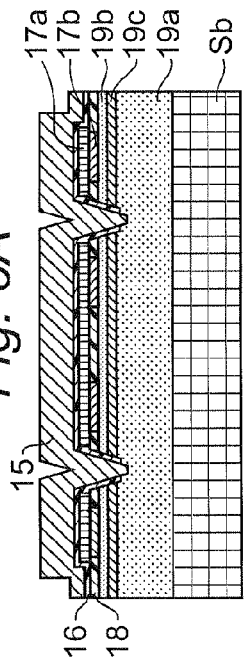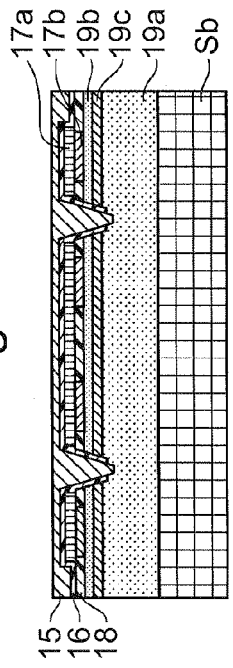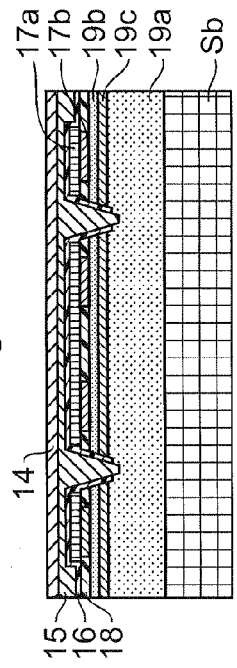

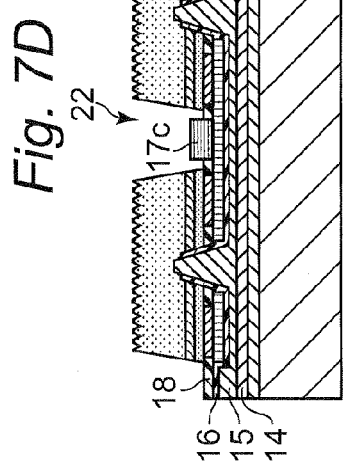
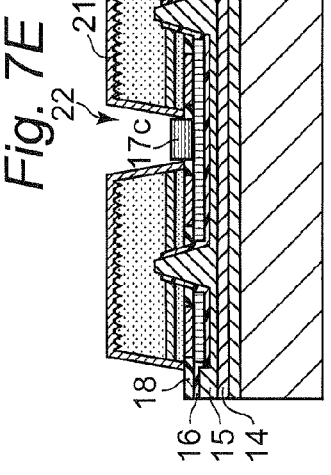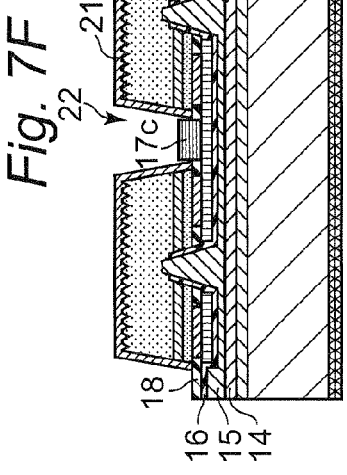
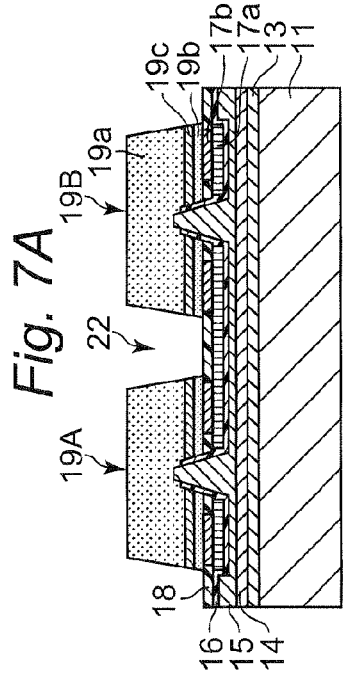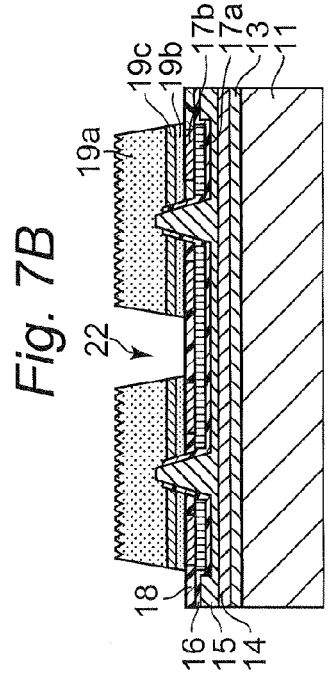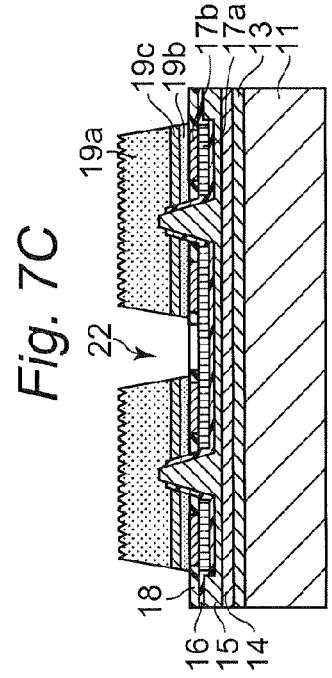

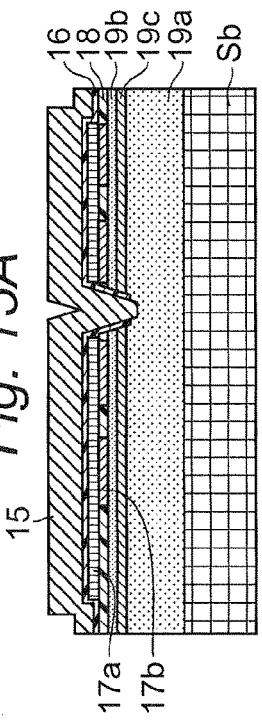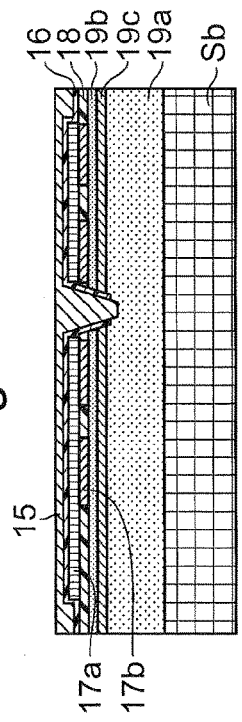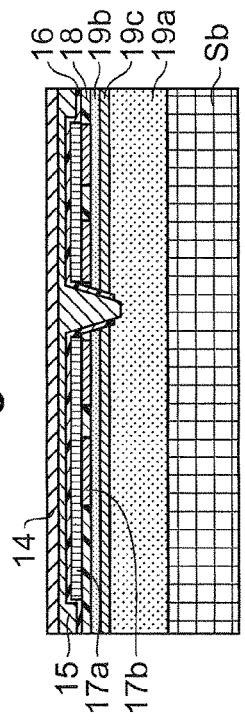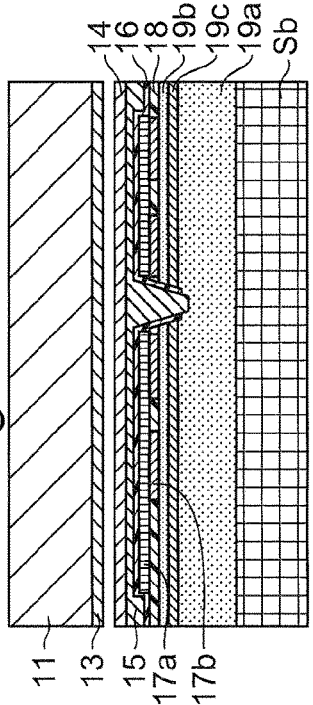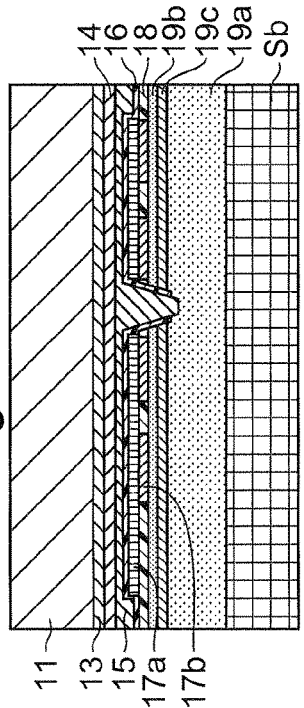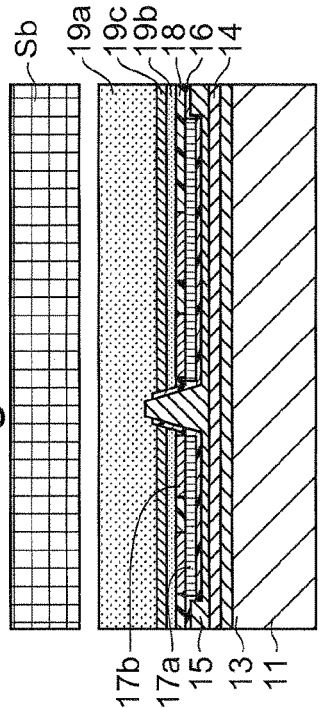

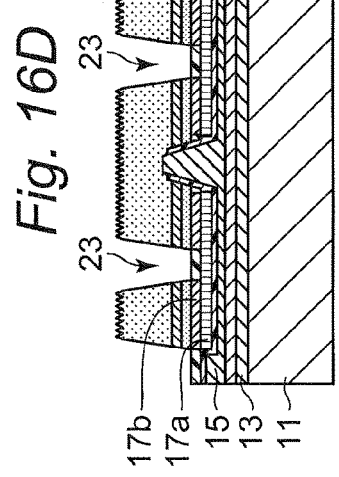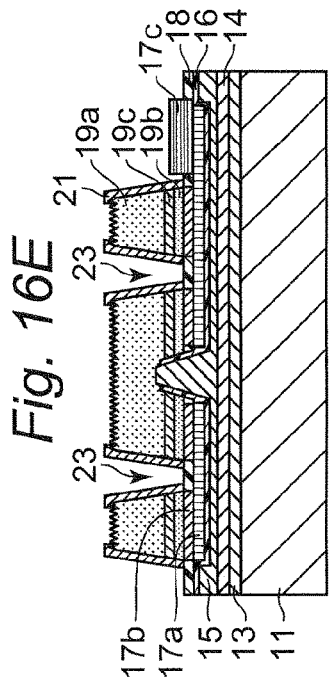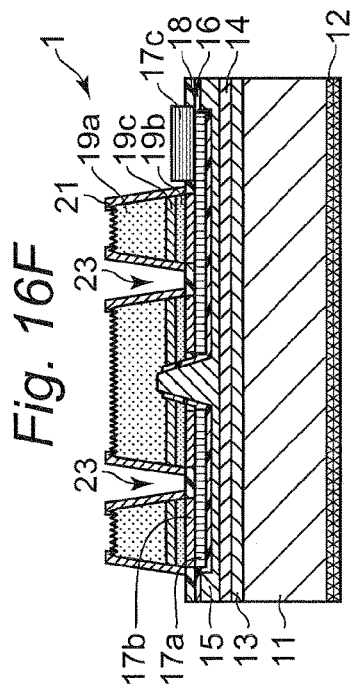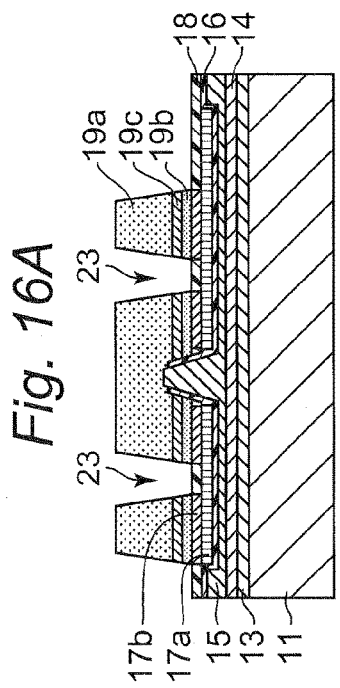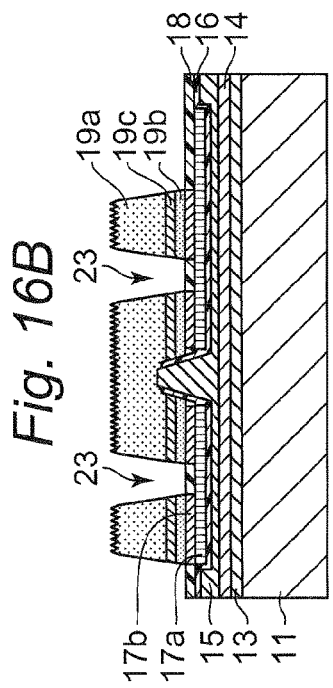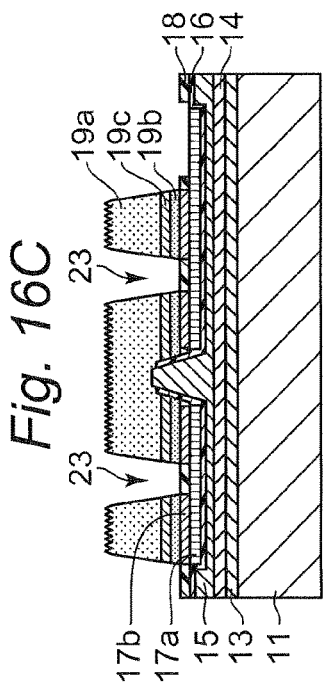

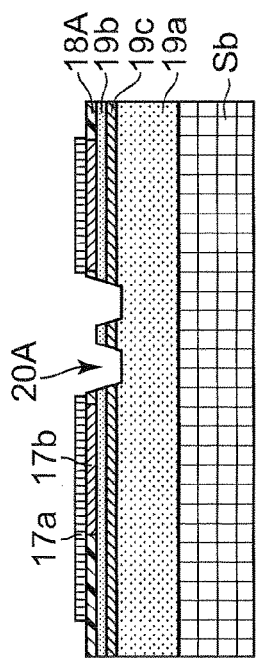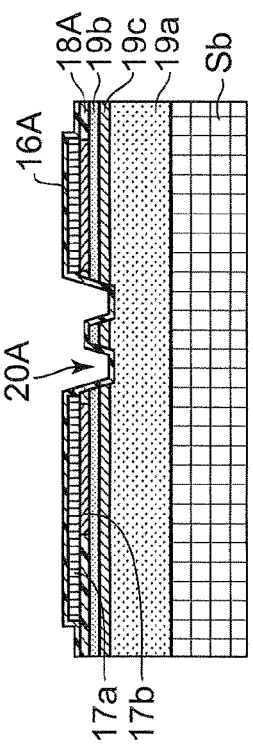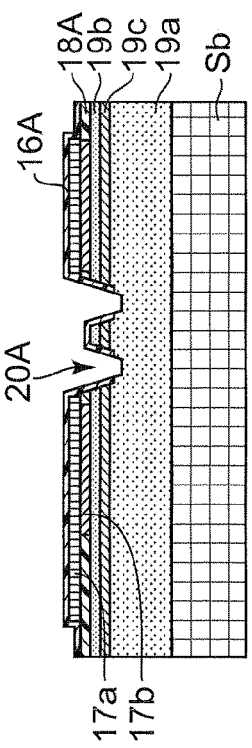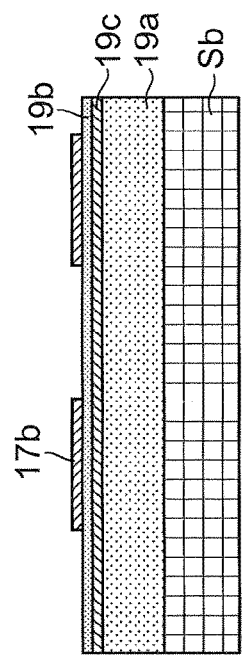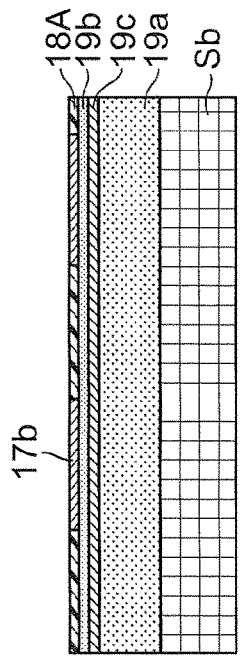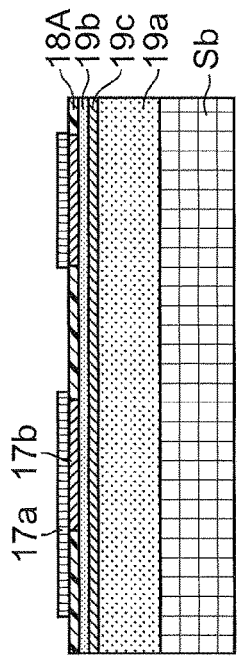

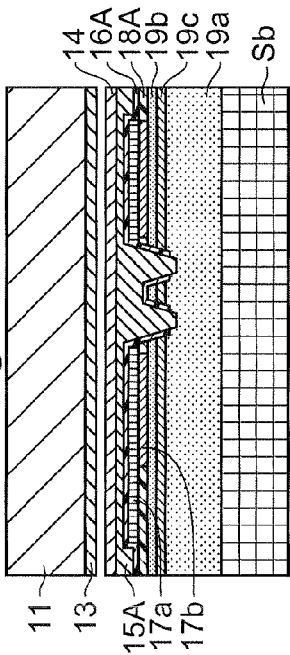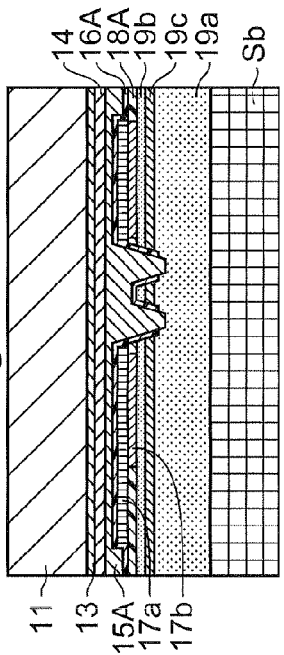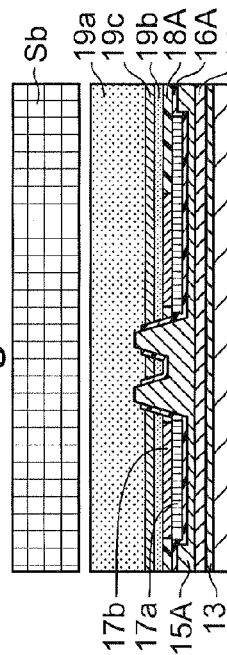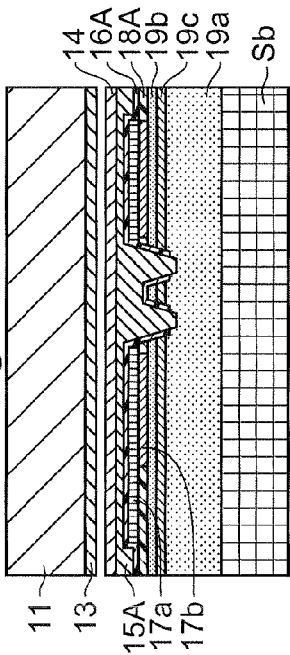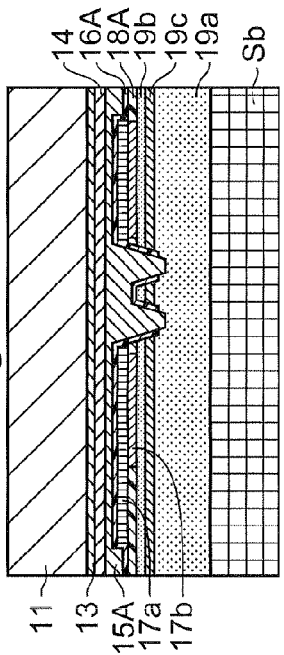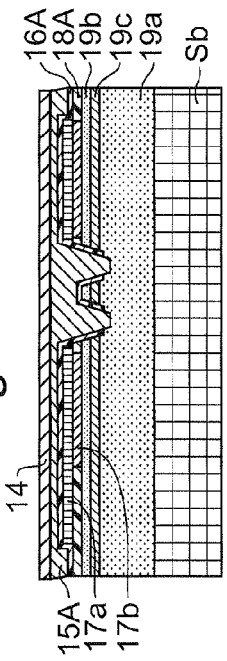

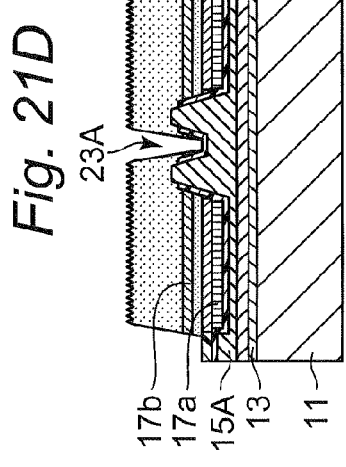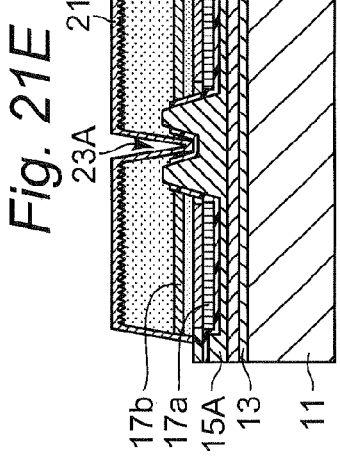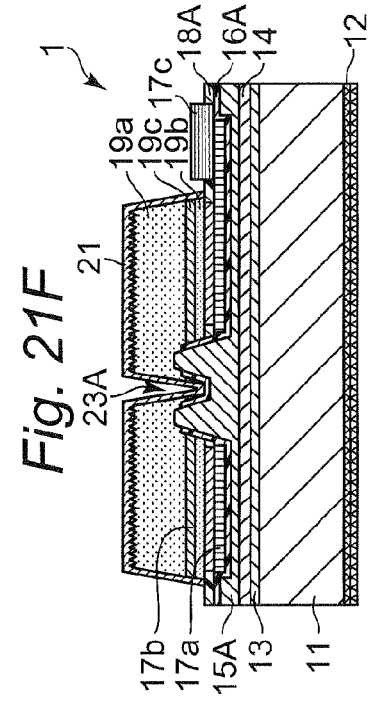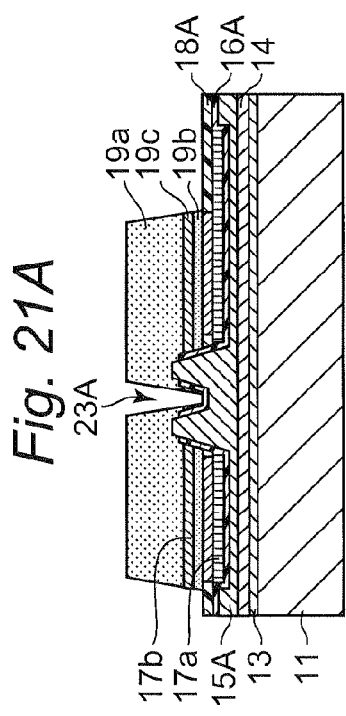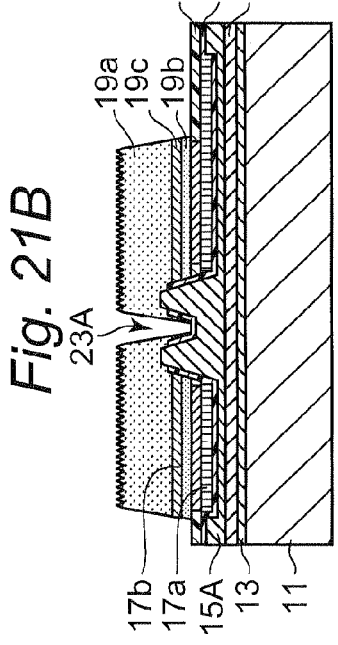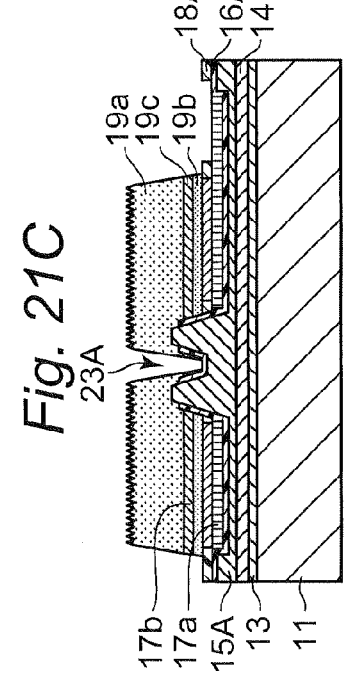

LIGHT EMITTING ELEMENT

CROSS REFERENCE TO RELATED APPLICATIONS

This application is a divisional application of U.S. application Ser. No. 14/060,654 filed Oct. 23, 2013, which claims the benefit of priority to JP Application No. 2012-234538 filed Oct. 24, 2012, and JP Application No. 2012-234537 filed Oct. 24, 2012, the contents of which applications are incorporated by reference herewith in their entirety.

BACKGROUND OF THE INVENTION

Field of the Invention

The present invention relates to a semiconductor light emitting element in which an electrode is placed between a semiconductor laminate and a substrate.

Description of Related Art

Proposals have been made to improve the luminous efficiency of a semiconductor light emitting element such as LED by dividing the semiconductor layer into a plurality of pieces (see U.S. Pat. No. 7,786,498). For example, in the semiconductor light emitting element proposed in U.S. Pat. No. 7,786,498, a semiconductor laminate is divided in a plurality of pieces to reduce the area of an electrode on each divided piece of the semiconductor laminate, so as to reduce the light absorption by the electrodes as low as possible. Furthermore, in the semiconductor light emitting element, since the area of each divided semiconductor laminate is reduced, the electric current can be diffused more uniformly compared to one with an undivided single semiconductor laminate, which results in enhanced luminous efficiency.

However, since the semiconductor light emitting element proposed in U.S. Pat. No. 7,786,498 has a current path in the order of a conductive substrate, a second electrode, the semiconductor laminate and a first electrode (a contact hole, a wiring pattern and a bonding part), the electric current is concentrated in an area around the bonding part of the first electrode embedded in the semiconductor laminate (in this case, the center area of the semiconductor laminate). That is, the current diffusion in the semiconductor laminate is actually uneven, and the light emitting element therefore has a problem of decrease in luminous efficiency.

SUMMARY OF THE INVENTION

It is an object of the present invention to provide a semiconductor light emitting element with high luminous efficiency.

In order to accomplish the above object, a light emitting element according to a first aspect of the present invention includes:

a substrate;

a semiconductor laminate placed above the substrate, the semiconductor laminate comprising a second semiconductor layer, an active layer and a first semiconductor layer laminated in this order from the substrate; and a first electrode and a second electrode placed between the substrate and the semiconductor laminate, wherein the semiconductor laminate is divided in a plurality of semiconductor blocks by a groove, wherein the first electrode includes protrusions that are provided in each of the plurality of semiconductor blocks and that penetrate the second semiconductor layer and the active layer to be connected to the first semiconductor layer, and wherein the second electrode is connected to the second semiconductor layer in each of the plurality of semiconductor blocks and has an external connector that is exposed on the bottom of the groove.

In order to accomplish the above object, a semiconductor light emitting element according to a second aspect of the present invention includes:

a substrate;

a semiconductor laminate placed above the substrate, the semiconductor laminate comprising a second semiconductor layer, an active layer and a first semiconductor layer laminated in this order from the substrate; and a first electrode and a second electrode placed between the substrate and the semiconductor laminate, wherein the semiconductor laminate comprises a hole that penetrates the first semiconductor layer, the active layer and the second semiconductor layer, and wherein the first electrode comprises a protrusion that penetrates the second semiconductor layer and the active layer to be connected to the first semiconductor layer.

With the light emitting element of the present invention, it is possible to improve luminous efficiency.

BRIEF DESCRIPTION OF THE DRAWINGS

FIGS. 6A through 6F are schematic views illustrating a part of the manufacturing method of the semiconductor light emitting element according to the first aspect of the present invention.

FIGS. 7A through 7F are schematic views illustrating a part of the manufacturing method of the semiconductor light emitting element according to the first aspect of the present invention.

FIGS. 15A through 15F are schematic views illustrating a part of the manufacturing method of the semiconductor light emitting element according to the second embodiment of the present invention.

FIGS. 16A through 16F are schematic views illustrating a part of the manufacturing method of the semiconductor light emitting element according to the second embodiment of the present invention.

FIGS. 19A through 19F are schematic views illustrating a part of a manufacturing method of the semiconductor light emitting element according to the third embodiment of the present invention.

FIGS. 20A through 20F are schematic views illustrating a part of a manufacturing method of the semiconductor light emitting element according to the third embodiment of the present invention.

FIGS. 21A through 21F are schematic views illustrating a part of a manufacturing method of the semiconductor light emitting element according to the third embodiment of the present invention.

DETAILED DESCRIPTION OF THE EMBODIMENTS

Figure 1:
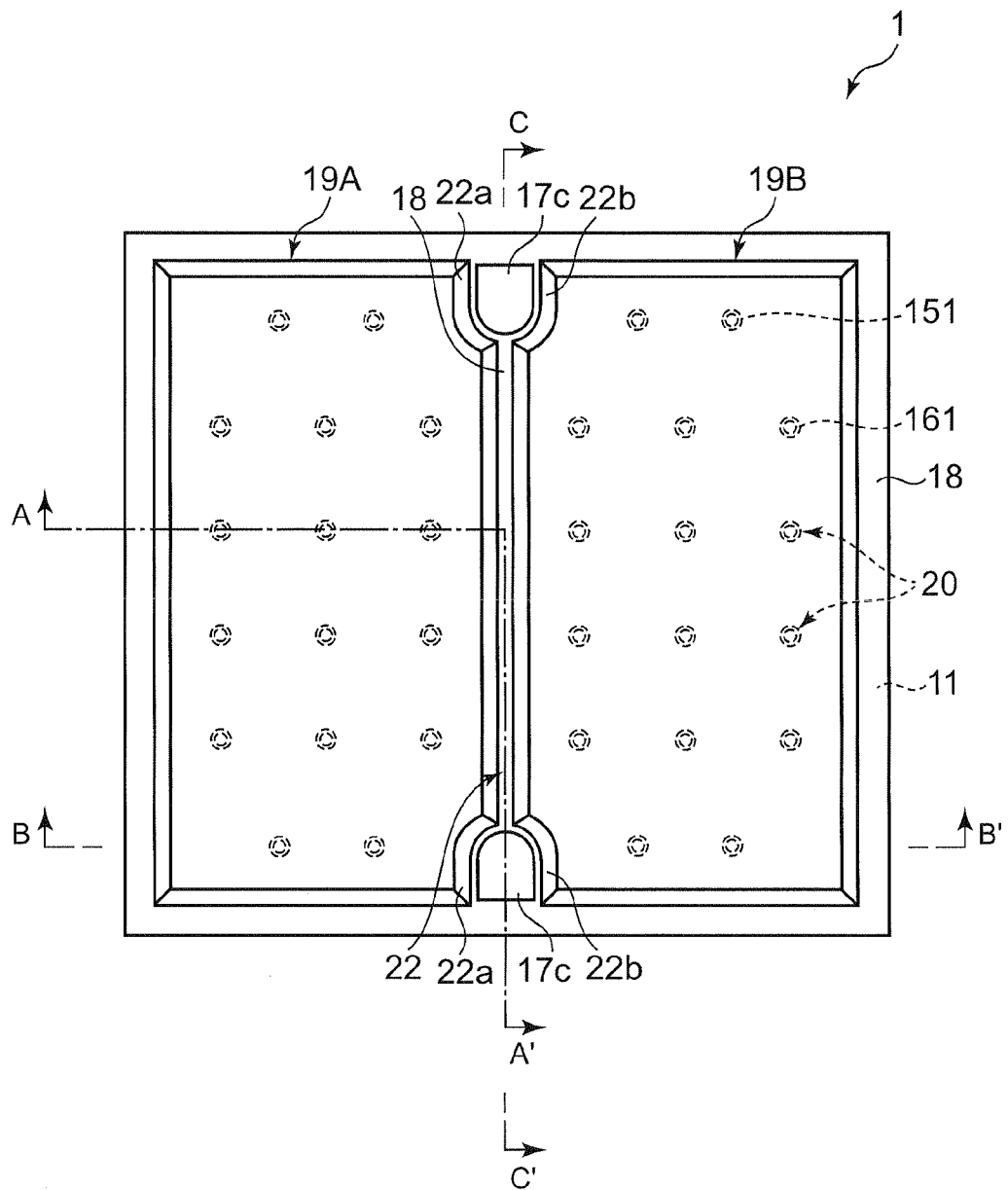
FIG. 1 is a plan view illustrating the overall structure of a semiconductor light emitting element according to a first embodiment of the present invention.

A semiconductor light emitting element according to a first embodiment of the present invention will be described below with reference to the accompanying drawings. The drawings referenced in the following description are merely schematic illustrations of the present invention. Therefore, some of them may include exaggerations of the scales, intervals, positional relationship and the like, or some of the components may not be illustrated in the drawings. Further, in the following description, the same names or reference signs basically refer to the same or similar components, and detailed description thereof are omitted.

(Structure of Semiconductor Light Emitting Element)

The structure of the semiconductor light emitting element 1 according to the first embodiment of the present invention will be described below with reference to FIGS. 1 to 4.

Figure 2:
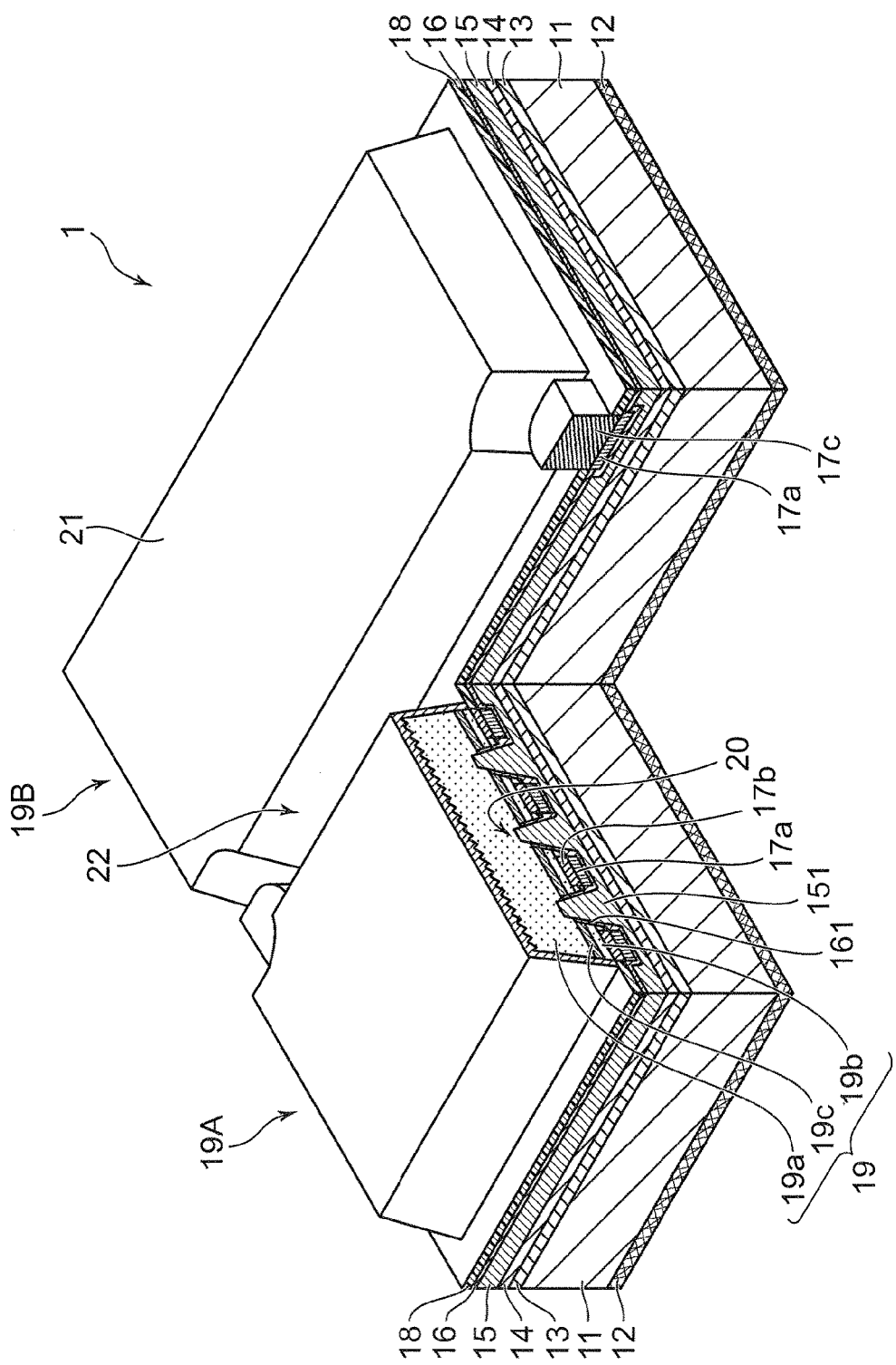
FIG. 2 is a perspective partially-cutaway view illustrating the overall structure of the semiconductor light emitting element according to the first embodiment of the present invention, i.e. a cross sectional view taken along line A-A' of FIG. 1.
Figure 3:
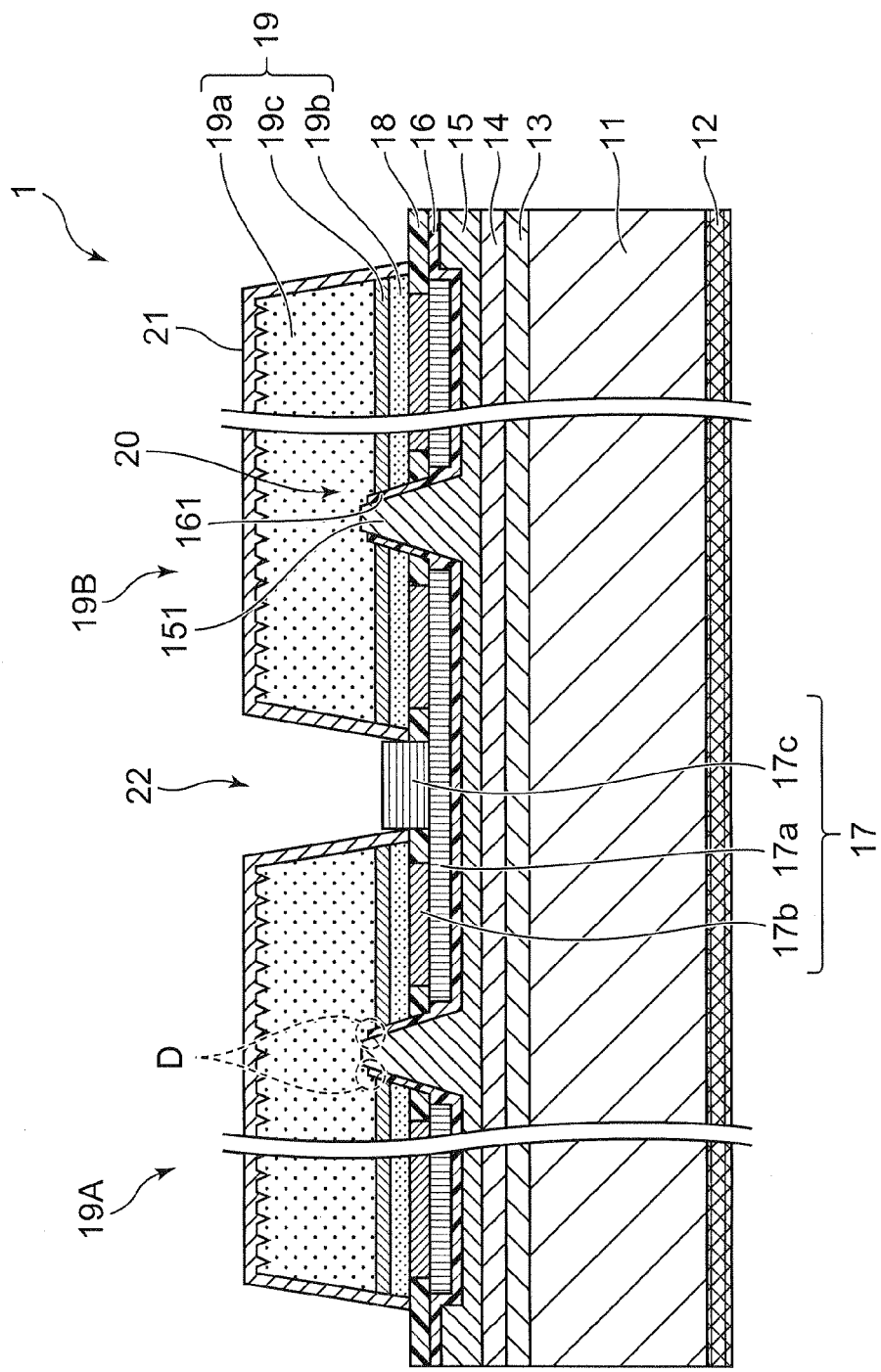
FIG. 3 is a partially-cutaway view illustrating the overall structure of the semiconductor light emitting element according to the first embodiment of the present invention, i.e. a cross sectional view taken along line B-B' of FIG. 1.

The semiconductor light emitting element 1 is formed in an approximately rectangular shape in a plan view as illustrated in FIG. 1. Specifically, as illustrated in FIG. 3, the semiconductor light emitting element 1 has a shape such that two upper portions each has a shape of an approximate frustum of rectangular pyramid and are placed on a flat plate having a predetermined thickness on either side of a groove 22. That is, as illustrated in FIGS. 2 and 3, the upper portion of the semiconductor light emitting element 1, which originally has an approximately trapezoidal cross section, is divided in the two upper portions each having a shape of an approximately frustum of rectangular pyramid by the groove 22 mentioned below. Further, as illustrated in FIGS. 1 and 2, the two truncated upper portions of the semiconductor light emitting element 1 have cutouts at both one and the other ends of the groove 22. These cutouts 22a and 22b define the areas for external connectors 17c of the second electrode 17 mentioned below. In other words, in the semiconductor light emitting element 1, the two upper portions having a shape of an approximate frustum of rectangular pyramid have cutouts at each of the opposite corners across the groove 22 as illustrated in FIG. 2.

As illustrated in FIG. 3, the semiconductor light emitting element 1 of the embodiment includes the substrate 11 with a back face adhesion layer 12, and further includes a substrate adhesion layer 13, a first electrode adhesion layer 14, the first electrode 15, an insulation film 16, the second electrode 17, a first protection film 18, the semiconductor laminate 19 and a second protection film 21, which are laminated on the substrate 11. FIG. 3 corresponds to the cross section taken along line B-B' of FIG. 1, but for descriptive reasons, it illustrates only two of four sets of a through holes 20, a protrusion 151 of the first electrode 15 and a projected opening 161 of the insulation film 16 that are supposed to appear on the B-B' cross sectional face.

The semiconductor laminate 19 is a laminate of a plurality of semiconductor layers including a second semiconductor layer 19b, an active layer 19c and a first semiconductor layer 19a, and as mentioned above, is divided in two upper portions each having a shape of approximate frustum of rectangular pyramid by the groove 22. Hereinafter, one of the two upper portions having a shape of an approximate frustum of rectangular pyramid is referred to as a semiconductor block 19A, and the other is referred to as a semiconductor block 19B.

The semiconductor light emitting element 1 of the first embodiment will be described more specifically. The substrate 11 is provided with the back face adhesion layer 12 on the lower face thereof. The substrate adhesion layer 13 is provided on the entire upper face of the substrate 11, and is conductive and electrically connected to the substrate 11.

The first electrode adhesion layer 14 is provided on the entire upper face of the substrate adhesion layer 13, and is conductive and electrically connected to the substrate adhesion layer 13.

On the entire upper face of the first electrode adhesion layer 14, the first electrode 15 is provided to supply the first semiconductor layer 19a with electric current. The first electrode 15 includes the plurality of protrusions 151 projecting toward the semiconductor laminate 19 (upward in the figure), and is electrically connected to the first semiconductor layer 19a through the protrusions 151. On the first electrode 15, the insulation film 16 is placed covering the first electrode 15 except for the tips of the protrusions 151. The insulation film 16 insulates the first electrode 15 from the second electrode 17 as well as from the second semiconductor layer 19b and the active layer 19c.

On the insulation film 16, the second electrode 17 is provided to supply the second semiconductor layer 19b with electric current. The second electrode 17 includes internal connectors 17b, a wiring pattern 17a and external connectors 17c. The internal connectors 17b are in contact with almost the entire face of the second semiconductor layer 19b to form an ohmic contact with the second semiconductor layer 19b. The wiring pattern 17a reduces the interconnection resistance of the second electrode 17 as well as connects the internal connector 17b of the semiconductor block 19A to the internal connector 17b of the semiconductor block 19B. The external connector 17c is provided on the bottom face of the groove 22, and is connected to the wiring pattern 17a.

It is preferred that there are a plurality of the external connectors 17c provided on the bottom of the groove 22. In the first embodiment, the plurality of external connectors 17c are placed opposed to each other on one and the other longitudinal ends of the groove 22. This allows for uniform current injection to the semiconductor laminate 19 from the positions at one and the other ends of the groove 22.

On the surface area of the insulation film 16 where the second electrode 17 is not formed, the first protection film 18 is provided. As illustrated in FIG. 3, the first protection film 18 is placed in the same layer with the internal connectors 17b so as to fill in the gap between the internal connectors 17b. Further, the first protection film 18 is formed covering the upper face of the insulation film 16 that extends out beyond the semiconductor laminate 19 to be exposed. The first protection film 18 may be made of, for example, white resin composed of a resin and a light diffuser such as $TiO_2$, or distributed Bragg reflector film. This allows the first protection film 18 to serve as a light reflector to reflect part of the light emitting from the active layer 19c.

The second protection layer 21 is formed covering the entire upper and side faces of the semiconductor blocks 19A and 19B of the semiconductor laminate 19, so as to protect the semiconductor laminate 19 from short-circuit caused by dust or the like and physical damages.

The first electrode 15, which is located apart from the first semiconductor electrode 19a as mentioned above, includes the protrusions 151 each of which projects penetrating the insulation film 16, first protection film 18, second semiconductor layer 19b and active layer 19c as illustrated in FIG. 3, which is mentioned below, so as to be connected to the first semiconductor layer 19a through the protrusions 151. It is preferred that the first electrode 15 includes a plurality of the protrusions 151 which are dispersed such that each of the two semiconductor blocks 19A and 19B is provided with a plurality of protrusions 151. This can equalize the current density to reduce the Vf (forward voltage) while keeping a large light emitting area, which results in uniform light emission.

The second electrode 17 is connected to both of the second semiconductor layer 19b of the semiconductor block 19A and the second semiconductor layer 19b of the semiconductor block 19B, and includes the external connectors 17c exposed on the bottom of the groove 22.

Since the external connectors 17c are provided on the bottom of the groove that separates the semiconductor laminate, i.e. between the two semiconductor blocks 19A and 19B as mentioned above, the electric current supplied to the external connectors 17c can be equally distributed to the two semiconductor blocks 19A and 19B while it is prevented from being concentrated in a certain part of the semiconductor laminate. That is, if electric current is supplied to a non-divided single large semiconductor laminate from a certain part, the current tends to be concentrated in the part of the semiconductor laminate. In contrast, in the semiconductor light emitting element 1 according to the first embodiment of the present invention, the semiconductor laminate is divided, and the external connectors 17c of the second electrode 17 are formed between the semiconductor block 19A and the semiconductor block 19B. As a result, the electric current can be distributed to the semiconductor block 19A and the semiconductor block 19B without being concentrated in a certain part of the semiconductor laminate.

Further, in the semiconductor light emitting element 1 of the first embodiment, dividing the semiconductor laminate by the groove allows the active layer to be exposed on the side face of the groove 22. As a result, the light emitting from the exposed active layer can be emitted outside through the groove 22, which results in improved light extraction efficiency. That is, if a non-divided comparatively large semiconductor laminate is used, for example, the light emerging from the part of the active layer located in the center of the semiconductor laminate passes through a long transfer path before being emitted. This increases the proportion of the light absorbed by the semiconductor layers or the like, which results in low light extraction efficiency. In contrast, the semiconductor light emitting element 1 of the first embodiment does not have such a problem. As used herein, the phrase "the active layer is exposed" refers to a condition that allows light to be emitted from the side faces of the groove 22. Accordingly, the side faces may be covered with a transparent resin or the like, for example.

Each component of the first embodiment will be described in detail below.

(Substrate 11)

The substrate 11 is bonded to the semiconductor laminate 19 and the like sandwiching the electrode or the like to support the semiconductor laminate 19 and the like. As illustrated in FIGS. 1 through 3, the substrate 11 is formed in an approximately rectangular plate. Further, as illustrated in FIG. 3, the substrate 11 is provided with the back face adhesion layer 12 and the substrate adhesion layer 13 respectively on its lower and upper faces. The area of the substrate 11 is not particularly limited, and is suitably selected according to the size of the components laminated on the substrate 11. The thickness of the substrate 11 is preferably 50 μm to 500 μm in terms of heat dissipation.

The examples of such substrates 11 include Si substrates as well as semiconductor substrates made of GaAs or the like and conductive substrates made of metal material such as Cu, Ge and Ni or composite material such as Cu—W and Cu—Mo. In addition, ceramic material such as AlN and SiC or metal-ceramic composites such as AlSiC, AlSi and Cu— diamond may also be employed as the substrate 11. Such composites may be represented by a general formula, as Cu—W and Cu—Mo composites are respectively represented by $Cu_xW_{100-x}$ ($0 \leq x \leq 30$), $Cu_xMo_{100-x}$ ($0 \leq x \leq 50$).

Si substrates are named as an example of the substrate 11 because of its advantageous low price and ease of processing into a chip form. Meanwhile, the substrate 11 made of a conductive substrate is advantageous because such substrates can supply electric power and can impart high electrostatic discharge withstand voltage and good heat dissipation to the element.

It is preferred that the substrate 11 is made of, for example, Si or Cu (Cu—W), and that an electrode or a light reflecting structure is provided between the substrate 11 and the semiconductor laminate 19. This can improve the heat dissipation property and the light emission property of the semiconductor light emitting element 1.

(Back Face Adhesion layer 12)

The back face adhesion layer 12 is electrically connected to the substrate 11, and serves as a layer for mounting the semiconductor light emitting element 1 to, for example, a mount board of a light emitting device (not shown). As illustrated in FIG. 3, the back face adhesion layer 12 is formed on the entire lower face of the substrate 11, i.e. on the substrate 11 opposite the substrate adhesion layer 13. The thickness of the back face adhesion layer 12 is not particularly limited, and may be suitably adjusted according to desired adhesiveness and conductivity. Examples of such back face adhesion layers 12 include layers containing a metal such as $TiSi_2$, Ti, Ni, Pt, Ru, Au, Sn and Al and the laminates of such layers. The back face adhesion layer 12 may be made of the same material as the substrate adhesion layer 13 or first electrode adhesion layer 14, which are mentioned below. For example, they may be made of conductive resin material.

(Substrate Adhesion layer 13)

The substrate adhesion layer 13 bonds the substrate 11 to the first electrode adhesion layer 14, and electrically connects the substrate 11 to the first electrode adhesion layer 14. As illustrated in FIG. 3, the substrate adhesion layer 13 is formed on the entire upper face of the substrate 11, i.e. on the substrate 11 opposite the back face adhesion layer 12, and is electrically connected to the substrate. The thickness of the substrate adhesion layer 13 is not particularly limited, and may be suitably adjusted according to desired adhesiveness and conductivity. Examples of such substrate adhesion layers 13 include layers containing a metal such as Al, Al alloys, $TiSi_2$, Si, Ti, Ni, Pt, Au, Sn Pd, Rh, Ru and In and the laminates of such layers.

It is preferred that the substrate adhesion layer 13 includes a contact layer, a barrier layer and a bonding layer. This allows the substrate adhesion layer 13 to serve as both bonding and electric power supply like the first electrode 15. If the substrate adhesion layer 13 is a metal laminate as mentioned above, it is preferred that the topmost face thereof is made of Au to form an Au—Au bonding with the first electrode adhesion layer 14. For example, it may be a laminate of $TiSi_2$/Pt/AuSn, $TiSi_2$/Pt/Au, Ti/Pt/Au, Ti/Ru/Au in this order from the side of the substrate 11. If the topmost surfaces of the substrate adhesion layer 13 and the first electrode adhesion layer 14 are both made of Au to form an Au—Au bonding at the interface, it can improve the thermal resistance, and thereby can improve the reliability of the semiconductor light emitting element 1.

(First Electrode Adhesion Layer 14)

The first electrode adhesion layer 14 bonds the first electrode 15 to the substrate adhesion layer 13, and electrically connects the substrate adhesion layer 13 to the semiconductor laminate 19. As illustrated in FIG. 3, the first electrode adhesion layer 14 is formed on the entire lower face of the first electrode 15. The thickness of the first electrode adhesion layer 14 is not particularly limited, and may be suitably adjusted according to desired adhesiveness and conductivity. As with the above-mentioned substrate adhesion layer 13, examples of such first electrode adhesion layers 14 include layers containing a metal such as Al, Al alloys, $TiSi_2$, Si, Ni, Ti, Pt, Au, Sn, Pd, Rh, Ru and In and the laminates thereof.

As with the above-mentioned substrate adhesion layer 13, it is preferred that the first electrode adhesion layer 14 includes a contact layer, a barrier layer and a bonding layer. This allows the first electrode adhesion layer 14 to serve as both bonding and electric power supply like the first electrode 15. If the first electrode adhesion layer 14 is a metal laminate as mentioned above, it is preferred that the lowermost face thereof is made of Au to form Au—Au bonding to the substrate adhesion layer 13. For example, it may be a laminate of $TiSi_2$/Pt/AuSn, $TiSi_2$/Pt/Au, Ti/Pt/Au, Ti/Ru/Au in this order from the side of the first electrode 15. Further, if the topmost surfaces of the first electrode adhesion layer 14 and the substrate adhesion layer 13 are made of Au to form an Au—Au bonding at the interface, it can improve the thermal resistance and thereby offer higher reliability of the semiconductor light emitting element 2.

(First Electrode 15)

The first electrode 15 supplies the first semiconductor layer 19a with electric current. In the first embodiment where the first semiconductor layer 19a is an n-type semiconductor layer, the first electrode 15 serves as an n-electrode. As illustrated in FIG. 3, the first electrode 15 is formed on the entire upper face of the first electrode adhesion layer 14, and is opposed to the second electrode 17 across the insulation film 16 mentioned below. Further, the first electrode 15 is formed on a larger area than the area of the semiconductor laminate 19 (semiconductor block 19A and semiconductor block 19B). That is, the first electrode 15 has a larger area than the area of the semiconductor laminate 19, and has a step at the rim that extends out beyond the lower face of the semiconductor laminate 19. As used herein, the above "the area of the semiconductor laminate 19" means the footprint of the outer shape of the semiconductor laminate 19 as illustrated in FIG. 1, i.e. the sum of the lower face areas of the semiconductor blocks 19A and 19B of the semiconductor laminate 19 and the area of the groove 22 between them.

As illustrated in FIGS. 2 and 3, the first electrode 15 is provided with the plurality of protrusions 151 that project toward the semiconductor laminate 19 (upward in the figures), and is electrically connected to the first semiconductor layer 19a through the protrusions 151. The protrusions 151 have an approximately trapezoidal cross section as illustrated in FIG. 3. Further, as illustrated in FIGS. 1 through 3, the protrusions 151 are formed in an approximate cone frustum shape, i.e. approximately truncated cone shape. Further, as illustrated in FIG. 1, the protrusions 151 have an exactly round shape in a plan view. As illustrated in FIG. 1, there are 16 pieces of protrusions 151 in the lower portion of each of the semiconductor blocks 19A and 19B of the semiconductor laminate 19 mentioned below, i.e. there are 32 pieces in total. Accordingly, each of the semiconductor blocks 19A and 19B is connected to the protrusions 151 at 16 spots.

The protrusions 151 are arranged as illustrated in FIG. 1. To be more specific, the four protrusions 151 on the first line (the uppermost line in FIG. 1) and the six protrusions 151 on the second line are arranged in a triangular grid (houndstooth) pattern. Twenty-four pieces of protrusions 151 on the second to fifth lines are arranged in a quadrangular (square) grid pattern. The six protrusions 151 on the fifth line and the four protrusions 151 on the sixth line (the lowermost line in FIG. 1) are arranged in a triangular grid (houndstooth) pattern. This allows for large emission area of the semiconductor light emitting element 1, since the plurality of protrusions 151 each having a smaller area are dispersed. As a result, the Vf (forward voltage) of the light emitting element 1 can be reduced while the current density is kept uniform, which results in uniform light emission.

As illustrated in FIG. 3, the protrusions 151 project penetrating the insulation film 16, first protection film 18, second semiconductor layer 19b and active layer 19c, which are mentioned below, and are in contact with the first semiconductor layer 19a at their tips. Specifically, the protrusions 151 are inserted in the projected openings 161 of the insulation layer 16, and are connected to the first semiconductor layer 19a through the through holes 20 and projected openings 161. The projected openings 161 are inserted in the through holes 20 that penetrate the first protection film 18, second semiconductor layer 19b and active layer 19c.

The tip portions of the protrusions 151 are exposed from the projected openings 161, and the exposed parts are in contact with the first semiconductor layer 19a. Specifically, as illustrated in the areas D of FIG. 3, each protrusion 151 is in contact with the first semiconductor layer 19a at two parts, i.e. the upper and peripheral faces of the tip. In the semiconductor light emitting element 1, this increases the contact area between the protrusions 151 and the first semiconductor layer 19a, comparing to the case where the protrusions 151 are in contact with the first semiconductor layer 19a only at the upper faces of their tips for example. As a result, electric current can be easily dispersed in the first semiconductor layer 19a, and the forward voltage Vf is thereby reduced.

It is preferred that the protrusions 151 have the same contact area with the first semiconductor layer 19a between the plurality of semiconductor blocks 19A and 19B mentioned below. That is, while each protrusion 151 is in contact with the first semiconductor layer 19a at two parts, i.e. the upper and peripheral faces of the tip, it is preferred that the total contact area between the protrusions 151 and the first semiconductor layer 19a in the semiconductor block 19A is as same as the total contact area between the protrusions 151 and the first semiconductor layer 19a in the semiconductor block 19B. In the semiconductor light emitting element 1, this contributes to equal current distribution to the semiconductor blocks 19A and 19B. As used herein, the above "having the same contact area" includes not only that the contact areas are completely the same but also that the contact areas are substantially the same (including some errors).

In each of the plurality of semiconductor blocks 19A and 19B of the semiconductor laminate 19, which are mentioned below, it is preferred that the protrusions 151 are connected to the first semiconductor layer 19a at the plurality of spots through the plurality of through holes 20 of the semiconductor blocks 19A and 19B as illustrated in FIGS. 1 and 2. That is, in each of the semiconductor blocks 19A and 19B positioned on either side of the groove 22, the protrusions 151 penetrate the second semiconductor layer 19b and active layer 19c at a plurality of spots (16 spots each in the embodiment) so as to be in contact with the first semiconductor layer 19a at a plurality of spots (16 spots each in the embodiment) as illustrated in FIGS. 1 and 2. In the semiconductor light emitting element 1, since the first electrode 15 is electrically connected to the first semiconductor layer 19a at a plurality of spots through the plurality of protrusions 151, electric current can be uniformly dispersed over the semiconductor laminate 19.

Further, in the plurality of semiconductor block 19A and 19B of the semiconductor laminate 19, which are mentioned below, it is preferred that the protrusions 151 are connected to the first semiconductor layer 19a at symmetrical positions about the groove 22 through the plurality of through holes 20 of the semiconductor blocks 19A and 19B. In the semiconductor light emitting element 1, since the first electrode 15 is connected to the first semiconductor layer 19a through the plurality of protrusions 151 at equivalent positions between the semiconductor blocks 19A and 19B, electric current can be uniformly dispersed over the semiconductor blocks 19A and 19B.

The thickness of the first electrode 15 is not particularly limited, and may be suitably adjusted according to desired properties. However, the first electrode 15 has the same film thickness between the semiconductor blocks 19A and 19B. This contributes to equal current distribution to the semiconductor blocks 19A and 19B of the semiconductor light emitting element 1. As used herein, the thickness of the first electrode 15 means the sum of the height of the protrusions 151 and the film thickness at a part other than the protrusions 151. Further, the above "the same thickness" includes not only that the thicknesses are completely the same but also that the thicknesses are substantially the same (including some errors).

The first electrodes 15 may be made of, for example, metal such as Ni, Pt, Pd, Rh, Ru, Os, Ir, Ti, Zr, Hf, V, Nb, Ta, Co, Fe, Mn, Mo, Cr, W, La, Cu, Ag, Y, Al, Si and Au, or the oxide or nitride thereof. In addition, it may also be made of monolayer or laminated film of a metal or an alloy including at least one transparent conductive oxide selected from a group consisting of ITO, ZnO and $In_2O_3$ and the like. As illustrated in FIG. 3, the first electrode 15 is in contact with the first semiconductor layer 19a at its tips, and is adjacent to the semiconductor laminate 19 at the through holes 20 across the insulation film 16. It is preferred that the first electrode 15 is made of a material that can form desired ohmic contact with the first semiconductor layer 19a as well as that can reflect the light emerging from the active layer 19c. Specifically, it is preferably made of Al or an Al alloy.

(Insulation Film 16)

The insulation film 16 provides insulation among the first electrode 15, the second electrode 17 and the second semiconductor layer 19b and active layer 19c. As illustrated in FIG. 3, the insulation film 16 is formed covering the entire surface of the first electrode 15 except for the upper and peripheral faces of the tip portions of the protrusions 151 of the first electrode 15. Further, the insulation film 16 is formed between the first electrode 15 and the wiring pattern 17a of the second electrode 17 mentioned below.

As illustrated in FIGS. 2 and 3, the insulation film 16 includes the plurality of projected openings 161 that open and project toward the semiconductor laminate 19 (upward in the figures). The projected openings 161 cover the circumferential faces of the protrusions 151 of the first electrode 15. As seen in the cross sectional view of FIG. 3, the projected openings 161 are formed in a tubular shape. To be more specific, as illustrated in FIGS. 1 to 3, the projected openings 161 are formed in a hollow approximate cone frustum shape, i.e. hollow approximately truncated cone shape. Further, as illustrate in FIG. 1, the projected openings

161 are formed in an exactly round shape in a plan view. There are 16 pieces of projected openings 161 in the lower portion of each of the semiconductor blocks 19A and 19B of the semiconductor laminate 19. That is, there are 32 pieces in total.

As illustrated in FIG. 3, the projected openings 161 penetrate the first protection film 18, second semiconductor layer 19b and active layer 19c mentioned below, and are in contact with the first semiconductor layer 19a at the tips of the openings. To be more specific, the projected openings 161 are inserted in the through holes 20 that penetrate the first protection film 18, second semiconductor layer 19b and active layer 19c. In the semiconductor light emitting element 1, the insulation film 16 provides insulation between the first electrode 15 and the second electrode 17, and thereby allow for the three-dimensional structure of the electrodes.

The thickness of the protection film 16 is not particularly limited, and may be suitably adjusted according to desired properties. The insulation film 16 may be made of, for example, oxide film, nitride film or oxynitride film including at least one element selected from a group consisting of Si, Ti, V, Zr, Nb, Hf, Ta and Al. In particular, it may be made of $SiO_2$, $ZrO_2$, SiN, SiON, BN, SiC, SiOC, $Al_2O_3$, AlN, AlGaN or the like. The insulation film 16 may be a monolayer or laminate film of a single material or a laminate film of different materials. Alternatively, the insulation film 16 may also be made of distributed Bragg reflector (DBR) film.

(Second Electrode 17)

The second electrode 17 supplies the second semiconductor layer 19b with electric current. In the first embodiment where the second semiconductor layer 19b is a p-type semiconductor layer, the second electrode 17 serves as a p-type electrode. As illustrated in FIG. 3, the second electrode 17 is formed in a film shape under the second semiconductor layer 19b, and is placed opposed to the first electrode 15 across the insulation film 16. Specifically, the second electrode 17 includes the internal connectors 17b connected to the second semiconductor layer 19b, the wiring pattern 17a electrically connected to the second semiconductor layer 19b through the internal connector 17b, and the external connectors 17c connected to the wiring pattern 17a.

The wiring pattern 17a supplies the second semiconductor layer 19b of the plurality of semiconductor block 19A and 19B of the semiconductor laminate 19, which are mentioned below, with the electric current from the external connectors 17c through the internal connectors 17b. That is, the wiring pattern 17a connects the semiconductor blocks 19A and 19B to each other. As illustrated in FIG. 3, wiring pattern 17a is formed on the almost entire lower face of the second semiconductor layer 19b except for the areas of the projected openings 161 of the insulation film 16. Further, the wiring pattern 17a extends out beyond the lower face of the second semiconductor layer 19b to be exposed under the groove 22. On the wiring pattern 17a exposed under the groove 22, the external connector 17c mentioned below is provided.

Although not shown in the figures, the wiring pattern 17a is made of a plate having approximately the same area as the bottom area of the semiconductor laminate 19, and as illustrated in FIG. 3, has a plurality of openings (reference sign not given) that are formed concentrically with the projected openings 161 of the insulation film 16, in which the projected openings 161 are inserted. As with the internal connectors 17b mentioned below, the wiring pattern 17a is preferably made of a material that has high reflectance to the light from the active layer 19c and high conductivity.

The internal connectors 17b form good ohmic contact with the semiconductor laminate 19, and effectively reflect the light from the active layer 19c. As illustrated in FIG. 3, the internal connectors 17b are formed on almost the entire lower face of the second semiconductor layer 19b except for the areas of the protrusions 151 of the first electrode 15 and the area of the first protection film 18. On the lower face of the internal connectors 17b, the wiring pattern 17a is formed as illustrated in FIG. 3.

It is preferred that the internal connectors 17b are provided on 70% or more, more preferably 80% or more, yet more preferably 90% or more of the lower face area of the second semiconductor layer 19b. This can reduce the contact resistance, and can accordingly reduce the drive voltage of the semiconductor light emitting element 1. In particular, providing the internal connectors 17b on 70% or more of the area of the second semiconductor layer 19b makes it possible to reflect the light from the active layer 19c at almost the entire area of the second semiconductor layer 19b, which can improve the light extraction efficiency.

Specifically, although not shown in the figures, the internal connectors 17b are made of plates having approximately the same area as the bottom area of the semiconductor laminate 19. As illustrated in FIG. 3, the internal connectors 17b have a plurality of openings (reference sign not given) that are formed concentrically with the projected openings 161 of the insulation film 16, in which the projected openings 161 are inserted sandwiching the first protection film 18 mentioned below.

As a reflector for the light from the semiconductor laminate 19, the internal connectors 17b are preferably made of monolayer or laminate film of a metal or an alloy including at least one selected from a group consisting of Al, Rh and Ag, of which a metal film containing Ag or an Ag alloy is preferred. If the internal connectors 17b are made of laminate film for example, they may be a laminate of Pt/Ti/Ni/Ag in this order from the side of the substrate 11 so that Ag is positioned on the side of the semiconductor laminate 19. In order to prevent migration, the internal connectors 17b may be provided with another metal-containing layer that completely covers the side faces and the lower face (the side of the substrate 11) thereof to sever as a cover electrode. Further, in the semiconductor light emitting element 1, the wiring pattern 17a is placed under the internal connectors 17b, and the first protection film 18 covers the side faces of the internal connectors 17b as illustrated in FIG. 3. Therefore, they also serve as means for preventing migration.

Figure 4:
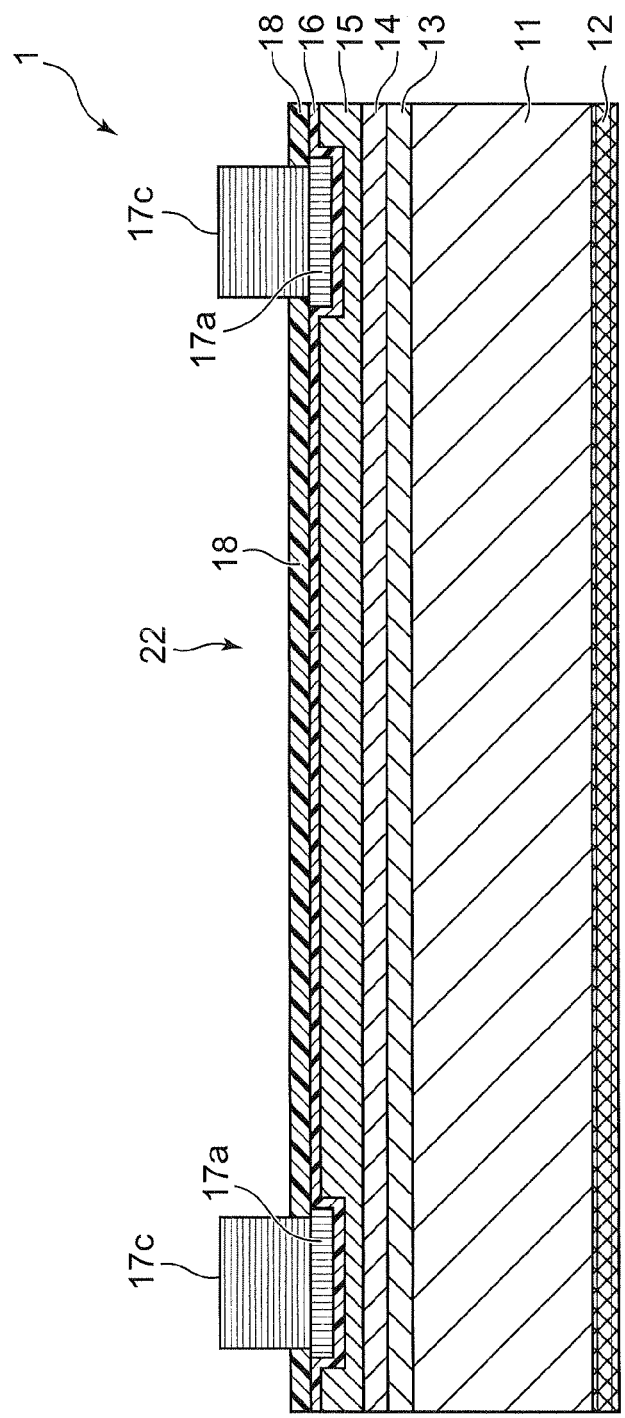
FIG. 4 is a partially-cutaway view illustrating the overall structure of the semiconductor light emitting element according to the first embodiment of the present invention, i.e. a cross sectional view taken along line C-C' of FIG. 1.

The external connector 17c serves as an electrode pad of the second electrode 17 to be connected to an external power source. As illustrated in FIG. 1, the external connectors 17c are exposed on the bottom of the groove 22. Specifically, as illustrated in FIGS. 2 through 4, the external connectors 17c are provided on the wiring pattern 17a, and penetrate the first protection film 18 to be exposed on the bottom of the groove 22.

It is preferred that the external connectors 17c are placed away from the corners of the semiconductor light emitting element 1. As used herein, the corners of the semiconductor light emitting element 1 refers to the four corners positioned near the corners of the substrate 11, and do not include the corners of the semiconductor blocks 19A and 19B positioned at one and the other ends of the groove 22. In the semiconductor light emitting element 1 of the first embodiment, a plurality of the external connectors 17c are provided on the bottom of the groove 22, specifically at one and the other longitudinal ends of the groove 22 as illustrated in FIGS. 1 through 4. Since the external connectors 17c are placed at one and the other ends of the groove 22, i.e. sandwiching the groove 22 that divides the semiconductor laminate 19, electric current is injected to the semiconductor laminate 19 from four spots, i.e. two corners of the semiconductor block 19A and two corners of the semiconductor block 19B. As a result, the electric current is uniformly injected over the semiconductor laminate 19.

Further, as illustrated in FIGS. 1 and 2, the groove 22 is broadened at one and the other longitudinal ends as the half-round cutouts at the corners of the semiconductor blocks 19A and 19B, and the two external connectors 17c are provided in the broad areas. That is, in the first embodiment, the two external connectors 17c are placed sandwiching the groove 22 as well as the part of each semiconductor block 19A and 19B of the semiconductor laminate 19 that lies along the groove 22. This further improves the uniform injection of the electric current to the semiconductor laminate 19 from one and the other ends of the groove 22. While the wiring pattern 17a, which connects the semiconductor block 19A and the semiconductor block 19B to each other, is formed in at least a part of the area under the bottom of the groove 22 including the area just under the external connectors 17c, it is preferred that the wiring pattern 17a is not formed in the area between the external connectors 17c. In the first embodiment, the wiring pattern 17a is provided under the bottom of the groove 22 except for the area between the external connectors 17c, i.e. the wiring pattern 17a is not formed in the area between the external connectors 17c under the bottom of the groove 22, which relieves electric current concentration in the area under or along the groove between the external connectors 17c of the semiconductor laminate 19, and thereby allows the electric current supplied from the two external connectors 17c to easily flow away from the groove 22. As a result, in the semiconductor light emitting element of the first embodiment, since the wiring pattern 17a has an opening under the bottom of the groove 22 between the external connectors 17c, electric current can be uniformly injected to the semiconductor blocks 19A and 19B.

Further, in the semiconductor light emitting element 1 of this case, it is preferred that the first electrode 15, i.e. an n-electrode, is made of a material that has higher light reflectance than the material of the wiring pattern 17a. For example, in the first embodiment, while the wiring pattern 17a may be made of a laminate of Ti/Rh/Ti in this order from the side of the substrate 11, the first electrode 15 may be made of a laminate of Au/Pt/Ti/AlCu in this order from the side of the substrate 11. In this case, the AlCu layer, i.e. the topmost surface of the first electrode 15 can serve as a light reflection layer (which mainly reflects return light) through the opening of the wiring pattern 17a formed under the groove 22. Here, since the first protection film 18 is made of $SiO_2$ for example, the light reaches the first electrode 15 through the opening.

As illustrated in FIG. 1, the external connectors 17c are formed in a half-round shape, and as illustrated in FIG. 3, has a predetermined height from the bottom of the groove 22. Further, although not shown in the figures, the external connectors 17c have a bump to be connected to an external power source through a conductive wire or the like on their upper faces.

Considering that such a conductive wire for external connection may block the light emission, it is preferred that the external connectors 17c are placed on the rim of the semiconductor light emitting element 1 as illustrated in FIG. 1. However, they may also be placed, for example, in the center of the semiconductor light emitting element 1. The size, shape, number and position of the external connectors 17c are not particularly limited, and may be suitably adjusted according to the size of the semiconductor light emitting element 1 and the size and shape of the semiconductor laminate 19.

It is preferred that the second electrode 17 has the same contact area with the second semiconductor layer 19b that is even between the plurality of semiconductor blocks 19A and 19B of the semiconductor laminate 19 mentioned below. That is, as the upper faces of the internal connectors 17b of the second electrode 17 are in contact with the lower face of the second semiconductor layer 19b as illustrated in FIG. 3, it is preferred that the total contact area between the upper face of one internal connector 17b and the lower face of the second semiconductor layer 19b of the semiconductor block 19A is as same as the total contact area between the upper face of the other internal connector 17b and the lower face of the second semiconductor layer 19b of the semiconductor block 19B. In the semiconductor light emitting element 1, this contributes to uniform distribution of the electric current flowing in the semiconductor blocks 19A and 19B. As used herein, the above "the same contact area" includes not only that the contact areas are completely the same but also that the contact areas are substantially the same (including some errors).

The thickness of the second electrode 17 is not particularly limited, and may be suitably adjusted according to desired properties. Further, the second electrode 17 has the same thickness between the semiconductor blocks 19A and 19B. In the semiconductor light emitting element 1, this contributes to uniform distribution of the electric current flowing in the semiconductor blocks 19A and 19B. As used herein, the above "the same thickness" includes not only that the thickness is completely the same but also that the thickness is substantially the same (including some errors).

The wiring pattern 17a and external connectors 17c of the second electrode 17 may be made of, for example, metal such as Ni, Pt, Pd, Rh, Ru, Os, Ir, Ti, Zr, Hf, V, Nb, Ta, Co, Fe, Mn, Mo, Cr, W, La, Cu, Ag, Y, Al, Si and Au, or the oxide or nitride thereof. In addition, it may also be made of monolayer or laminated film of a metal or an alloy including at least one transparent conductive oxide selected from a group consisting of ITO, ZnO and $In_2O_3$ and the like.

(First Protection Film (Light Reflector) 18)

As illustrated in FIG. 3, the first protection film 18 is placed in the same layer with the internal connectors 17b so as to fill the gaps between the internal connectors 17b and the external connectors 17c and the gaps between the internal connectors 17b and the projected openings 161 of the insulation film 16. Further, the first protection film 18 is formed covering the exposed part of the upper face of the insulation film 16 that extends out beyond the semiconductor laminate 19. That is, the first protection film 18 is provided between the wiring pattern 17a and the second protection film 21, between the wiring pattern 17a and the second semiconductor layer 19b, between the insulation film 16 and the second semiconductor layer 19b and between the insulation film 16 and the second protection film 21. The first protection film 18 may serve as a light reflector to reflect a part of the light emitted from the active layer 19c, and may be made of, for example, white resin composed of a resin and a light diffuser such as $TiO_2$ or distributed Bragg reflector film. Further, the first protection film 18 as a light reflector may be made of transparent insulation film of $SiO_2$ or the like, so as to reflect light on the interface between the transparent insulation film and the above-mentioned other components. The thickness of the first protection film 18 is not particularly limited, and may be suitably adjusted according to desired properties.

As illustrated in FIG. 4, it is preferred that the above-mentioned first protection film 18 is provided in the area except for the areas of the external connectors 17c on the bottom of the groove 22. That is, in the cross sectional view along the groove 22, the first protection film 18 is formed in the area between the two external connectors 17c and the areas on the outer sides of the two external connectors 17c. In the semiconductor light emitting element 1, even if the light emerging from the active layer 19c is emitted from the side faces of the semiconductor blocks 19A and 19B toward the bottom of the groove 22 for example, such light is reflected by the first protection film 18, which results in improved light extraction efficiency.

Further, as illustrated in FIG. 3, it is preferred that the first protection film 18 is placed under the second semiconductor layer 19b from the bottom of the groove 22. That is, in the cross sectional view as illustrated in FIG. 3, the first protection film 18 extends laterally out beyond the bottom area of the groove 22 to be in contact with the edges of the second semiconductor layer 19b of the semiconductor blocks 19A and 19B. In the semiconductor light emitting element 1, even if the light emerging from the active layer 19c is emitted toward the second semiconductor layer 19b of the semiconductor blocks 19A and 19B (downward), the first protection film 18 reflects it to prevent the light from leaking from the side of the substrate 11, which results in improved light extraction efficiency.

Further, as illustrated in FIG. 3, it is preferred that the first protection film 18 is formed symmetrically about the groove 22. In the semiconductor light emitting element 1, since the first protection film 18 is formed symmetrically about the groove 22, the light is equally reflected between the sides of the groove 22.

(Semiconductor Laminate 19)

The semiconductor laminate 19 serves as a light emitting part of the semiconductor light emitting element 1. As illustrated in FIG. 3, the semiconductor laminate 19 is placed above the substrate 11. Between the semiconductor laminate 19 and the substrate 11, the substrate adhesion layer 13, first electrode adhesion layer 14, first electrode 15, insulation film 16, second electrode 17 and first protection film 18 are placed. Specifically, as illustrated in FIG. 3, the semiconductor laminate 19 is formed on the internal connectors 17b of the second electrode 17 and the first protection film 18, and as illustrated in FIG. 2, is poked by the protrusions 151 of the first electrode 15 and the projected openings 161 of the insulation film 16 at a plurality of spots. As used herein, as illustrated in FIG. 3, the above "being poked" means that the protrusions 151 and the projected openings 161 thoroughly penetrate the second semiconductor layer 19b and the active layer 19c of the semiconductor laminate 19 to dig in a part of the first semiconductor layer 19a of the semiconductor laminate 19.

The semiconductor laminate 19 includes the second semiconductor layer 19b, the active layer 19c and the first semiconductor layer 19a, which are laminated in this order from the bottom. The first semiconductor layer 19a, second semiconductor layer 19b and active layer 19c are not specifically limited, and may be made of an InAlGaP, InP or AlGaAs material or the mixed crystal thereof or a nitride semiconductor such as GaN. Such nitride semiconductors include III-V nitride semiconductors ($In_XAl_YGa_{1-X-Y}N$ ($0 \leq X$, $0 \leq Y$, $X+Y \leq 1$) such as GaN, AlN, InN and the mixed crystals thereof. Further, the group III element may be partially or completely substituted with B, and element N of the group V element may be partially substituted with P, As or Sb to form a mixed crystal. These semiconductor layers are generally doped with an n-type or p-type impurity.

The first semiconductor layer 19a represents one of n-type and p-type semiconductor layers, and the second semiconductor layer 19b represents a semiconductor layer of a different type from the first semiconductor layer 19a, i.e. the other of n-type and p-type semiconductor layers. In a preferred embodiment of the semiconductor light emitting element 1, the first semiconductor layer 19a is an n-type semiconductor layer, and the second semiconductor layer 19b is a p-type semiconductor layer. Furthermore, the first semiconductor layer 19a has a resistance lower than the second semiconductor layer 19b. This enhances electric current diffusion in the first semiconductor layer 19a that is connected to the first electrode 15, and thereby can further relieve concentration of the electric current in the semiconductor laminate 19.

Each of the first semiconductor layer 19a and second semiconductor layer 19b of the semiconductor laminate 19 may have a monolayer structure or a laminate structure such as homo-, hetero- and doubleheterostructure with an PIN or PN junction. As illustrated in FIG. 3, the semiconductor light emitting element 1 may include the active layer 19c between the first semiconductor layer 19a (n-type semiconductor layer) and the second semiconductor layer 19b (p-type semiconductor layer) to allow the active layer 19c to serve as a light emitting part. Alternatively, the first semiconductor layer 19a (n-type semiconductor layer) and the second semiconductor layer 19b (p-type semiconductor layer) may be in direct contact with each other to serve as a light emitting part. The thickness of the first semiconductor layer 19a, second semiconductor layer 19b and active layer 19c of the semiconductor laminate 19 is not particularly limited, and may be suitably adjusted according to desired properties.

As illustrated in FIGS. 2 and 3, the semiconductor laminate 19 is divided in the plurality of semiconductor blocks (two semiconductor blocks 19A and 19B in the embodiment) by the groove 22 that cuts through the first semiconductor layer 19a, the active layer 19c and the second semiconductor layer 19b. As illustrated in FIGS. 1 and 2, the groove 22 is formed in a linear shape, and divides the semiconductor laminate 19 at the center of the semiconductor light emitting element 1. The width of the groove 22 may be suitably adjusted considering the balance between the increase in light output and the increase in drive voltage that are both caused by the groove 22.

As illustrated in FIG. 4, the bottom of the groove 22 is defined by the upper face of the first protection film 18. On this bottom of the groove 22, the external connectors 17c are provided and exposed as mentioned above. As illustrated in FIGS. 1 and 2, the groove 22 extends continuously to one and the other longitudinal ends, i.e. to the two external connectors 17c of the second electrode 17. At the external connectors 17c, corners of the semiconductor blocks 19A and 19B are cut off so that the groove 22 is broadened in a half-round shape.

As illustrated in FIG. 1, it is preferred that the width of the groove 22 is narrower than the width of the external connectors 17c. In the semiconductor light emitting element 1, this can minimize a decrease in light emission area caused by the groove 22 in the semiconductor laminate 19, which results in high luminous efficiency.

As illustrated in FIG. 1, it is preferred that the semiconductor blocks 19A and 19B, which are divided by the groove 22, have the same shape. In the semiconductor light emitting element 1, the semiconductor laminate 19 is equally divided by the groove 22, which contributes to uniform distribution of the electric current in the semiconductor blocks 19A and 19B. As used herein, the above "the same shape" includes not only that the shapes are exactly the same but also that the shapes are substantially the same (including some errors).

As illustrated in FIG. 3, the side faces of the semiconductor blocks 19A and 19B are inclined in a tapered shape. That is, as illustrated in FIGS. 1 to 3, the side faces of each of the semiconductor blocks 19A and 19B are inclined in a forward-tapered shape such that the first semiconductor layer 19a has smaller area than the second semiconductor layer 19b. As illustrated in FIG. 3, each of the semiconductor blocks 19A and 19B has an approximately trapezoidal cross section. Further, in the semiconductor light emitting element 1, two opposite side faces of the semiconductor blocks 19A and 19B that define the groove 22 are inclined in a tapered shape. Accordingly, in the semiconductor light emitting element 1, the edges between the upper face and the side faces of each of the semiconductor block 19A and 19B have obtuse angles, which can prevent cracks of the second protection film 21 that is continuously formed on the upper and side faces of the semiconductor blocks 19A and 19B. Further, in the semiconductor light emitting element 1, the tapered shape of the side faces of the semiconductor blocks 19A and 19B (side faces of the groove 22) allows the light emerging from the active layer 19c to be easily emitted from the tapered side faces, which results in improved light extraction efficiency. As used herein, being inclined in a tapered shape means that the side faces of the groove 22 are inclined such that the groove width increases with distance from the bottom of the groove 22.

Further, as illustrated in FIG. 3, it is preferred that the upper faces of the semiconductor blocks 19A and 19B, i.e. the upper face of the first semiconductor layer 19a are processed to have projections and depressions. In the semiconductor light emitting element 1, these textured upper faces of the semiconductor blocks 19A and 19B diffuse the light emerging from the active layer 19c before going out, which results in improved light extraction efficiency.

As illustrated in FIG. 3, each of the semiconductor blocks 19A and 19B has the plurality of through holes 20. The through holes 20 are formed by partially removing the second semiconductor layer 19b, active layer 19c and first semiconductor layer 19a of the plurality of semiconductor blocks 19A and 19B. Specifically, the through holes 20 penetrate the second semiconductor layer 19b and the active layer 19c in a round shape. In the through holes 20, the projected openings 161 of the insulation film 16 and the protrusions 151 of the first electrode 15 are inserted.

As illustrated in FIGS. 1 to 3, the through holes 20 are formed in an approximately cone frustum shape corresponding to the outer shape of the projected openings 161. Further, as illustrated in FIG. 1, the through holes 20 each have an exactly circular opening in a plan view. There are 16 pieces of through holes 20 in each of the semiconductor blocks 19A and 19B of the semiconductor laminate 19, i.e. there are 32 pieces in total. The through holes 20 of an exactly round shape as mentioned above can minimize the area that does not contribute to the light emission in the semiconductor laminate 19.

There are 16 pieces of through holes 20 in each of the semiconductor blocks 19A and 19B, i.e. there are 32 pieces in total in the semiconductor laminate 19. Further, in the semiconductor blocks 19A and 19B, the through holes 20 are positioned symmetrically about the groove 22. In the semiconductor light emitting element 1, the protrusions 151 of the first electrode 15 are inserted in the respective through holes 20 so that the first electrode 15 is connected to the first semiconductor layer 19a through the protrusions 151 at the equivalent positions between the semiconductor blocks 19A and 19B, which allows for uniform distribution of electric current over the semiconductor blocks 19A and 19B.

(Second Protection Film 21)

The second protection film 21 protects the semiconductor laminate 19 from short-circuit due to dust or the like and physical damages. As illustrated in FIG. 3, the second protection film 21 is formed covering the entire upper and side faces of the semiconductor blocks 19A and 19B of the semiconductor laminate 19. As illustrated in FIG. 3, the lower face of the second protection film 21 has projections and depressions corresponding to the projections and depressions of the upper face of the first semiconductor layer 19a.

The thickness of the second protection film 21 is not particularly limited, and may be suitably adjusted according to desired properties. As with the insulation layer 16 and the first protection film 18, the second protection film 21 may be made of, for example, oxide film, nitride film, oxynitride film or the like containing at least one element selected from a group consisting of Si, Ti, V, Zr, Nb, Hf, Ta and Al. In particular, it may be made of $SiO_2$, $ZrO_2$, SiN, SiON, BN, SiC, SiOC, $Al_2O_3$, AlN, or AlGaN. Further, the second protection film 21 may be made of monolayer or laminated film of a single material, or laminated film of different materials.

In the semiconductor light emitting element 1 with the above-mentioned structure, the external connectors 17c are provided on the bottom of the groove 22 that divides the semiconductor laminate 19, i.e. between the plurality of semiconductor blocks 19A and 19B. As a result, electric current supplied to the external connectors 17c uniformly flows over the semiconductor blocks 19A and 19B, and concentration of the electric current in a certain part of the semiconductor blocks 19A and 19B is relieved. Furthermore, in the semiconductor light emitting element 1, the semiconductor laminate 19 is divided by the groove 22 so that the active layer 19c is exposed on the groove 22. As a result, the light emerging from the active layer 19c is also emitted from the groove 22, which results in improved light extraction efficiency.

In conclusion, in the semiconductor light emitting element 1, the semiconductor laminate 19 is divided in the plurality of semiconductor blocks 19A and 19B and the external connectors 17c of the second electrode 17 are provided between the semiconductor blocks 19A and 19B, which allows for uniform electric current flow in the semiconductor blocks 19A and 19B and thereby results in improved luminous efficiency.

(Manufacturing Method of Semiconductor Light Emitting Element)

Hereinafter, a manufacturing method of the semiconductor light emitting element 1 according to the first embodiment of the present invention will be describe with reference to FIGS. 5 through 7 (see FIGS. 1 to 3 for the structure). As with the FIG. 3, FIGS. 5 through 7 referenced below are cross sectional views taken along line B-B' of FIG. 1, but illustrate only two of each of the through holes 20, the protrusions 151 of the first electrode 15 and the projected openings 161 of the insulation film 16, and the others are omitted.

Figure 5D:
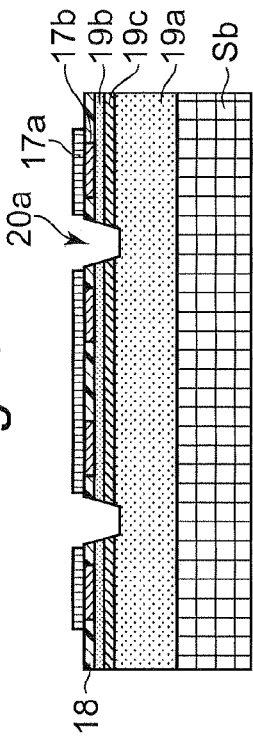
FIGS. 5A through 5F are schematic views illustrating a part of a manufacturing method of the semiconductor light emitting element according to the first embodiment of the present invention.
Figure 5E:
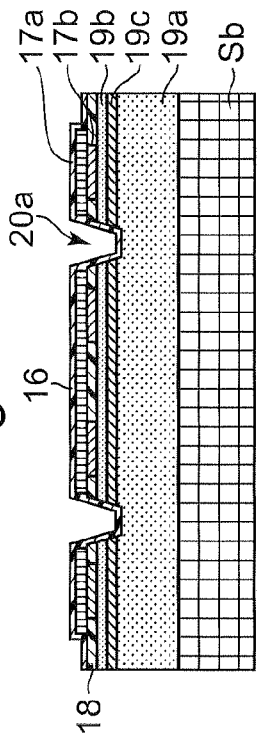
Figure 5F:
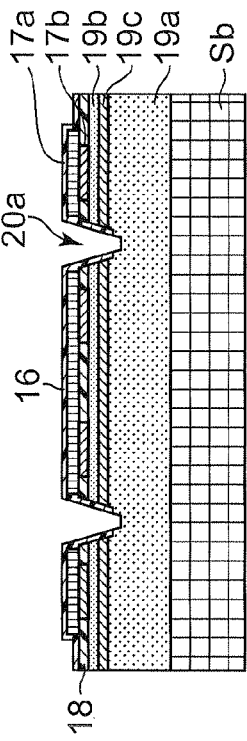
Figure 5A:
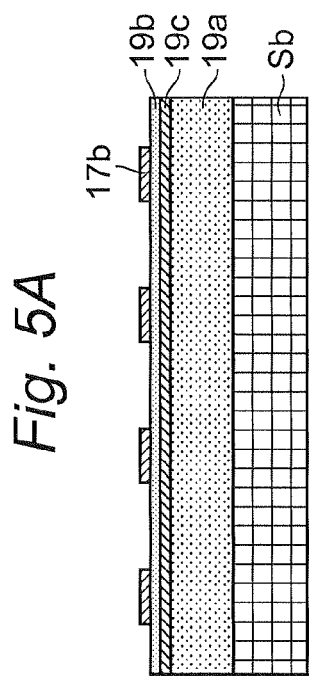
Figure 5B:
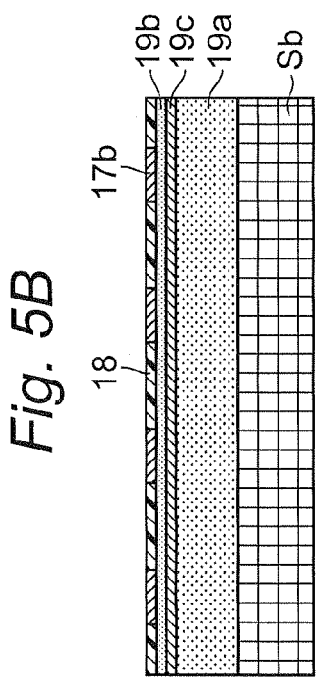
Figure 5C:
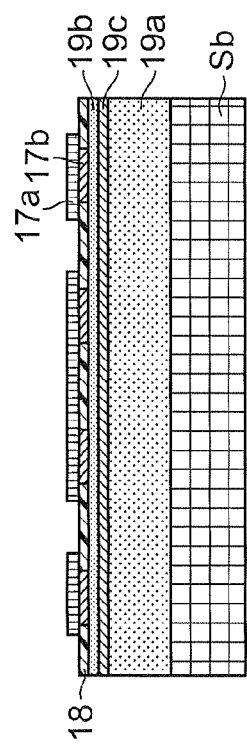

As illustrated in FIG. 5A, the manufacturing method of the semiconductor light emitting element 1 starts with forming the semiconductor laminate 19 composed of the first semiconductor layer 19a, active layer 19c and second semiconductor layer 19b on a sapphire substrate Sb by crystal growth, and then forming the internal connectors 17b of the second electrode 17 on predetermined areas of the second semiconductor layer 19b, for example, by means of sputtering. Next, as illustrated in FIG. 5B, the manufacturing method of the semiconductor light emitting element 1 proceeds to forming the first protection film 18 between the internal connectors 17b on the second semiconductor layer 19b, for example, by means of sputtering. Next, as illustrated in FIG. 5C, the manufacturing method of the semiconductor light emitting element 1 proceeds to forming the wiring pattern 17a on a predetermined area of the internal connectors 17b as well as first protection film 18, for example, by means of sputtering.

Next, as illustrated in FIG. 5D, the manufacturing method of the semiconductor light emitting element 1 proceeds to partially removing the first protection film 18, second semiconductor layer 19b, the active layer 19c and the first semiconductor layer 19a, for example, by dry etching, so as to form the plurality of through holes 20. As mentioned above, the through holes 20 are to receive insertion of the protrusions 151 of the first electrode 15 and the projected openings 161 of the insulation film 16. Next, as illustrated in FIG. 5E, the manufacturing method of the semiconductor light emitting element 1 proceeds to forming the insulation film 16 on the wiring pattern 17a, on the first protection film 18 and in the through holes 20, for example, by sputtering. Next, as illustrated in FIG. 5F, the manufacturing method of the semiconductor light emitting element 1 proceeds to removing the insulation film 16 on the bottoms of the through holes 20 by a predetermined depth, for example, by means of dry etching, so that the first semiconductor layer 19a is exposed.

Next, as illustrated in FIG. 6A, the manufacturing method of the semiconductor light emitting element 1 proceeds to forming a comparatively thick layer of the first electrode 15 on the insulation film 16 and in the through holes 20, for example, by means of sputtering. Next, as illustrated in FIG. 6B, the manufacturing method of the semiconductor light emitting element 1 proceeds to flattening the first electrode 15 by polishing such as chemical mechanical polishing (CMP). Next, as illustrated in FIG. 6C, the manufacturing method of the semiconductor light emitting element 1 proceeds to forming the first electrode adhesion layer 14 on the flattened first electrode 15, for example, by means of sputtering.

Next, as illustrated in FIG. 6D, the manufacturing method of the semiconductor light emitting element 1 proceeds to preparing the substrate 11 with the substrate adhesion layer 13, and then, as illustrated in FIG. 6E, bonding the substrate adhesion layer 13 of the substrate 11 and the first electrode adhesion layer 14 to each other. Next, as illustrated in FIG. 6F, the manufacturing method of the semiconductor light emitting element 1 proceeds to irradiating the element with laser light from the side of the sapphire substrate Sb according to the laser lift off method, so as to degrade the interface between the sapphire substrate Sb and the semiconductor laminate 19 (specifically, the first semiconductor layer 19a) to remove the sapphire substrate Sb.

Next, as illustrated in FIG. 7A, the manufacturing method of the semiconductor light emitting element 1 proceeds to etching the center area of the semiconductor laminate 19 until the first protection film 18 is exposed, for example, by dry etching, so as to form the groove 22. As a result, the semiconductor laminate 19 is divided in the plurality of semiconductor block 19A and 19B. At the same time, as illustrated in FIG. 7A, the peripheral area of the semiconductor laminate 19 is also etched until the first protection film 18 is exposed as well as the center area, so that the side faces of the semiconductor blocks 19A and 19B are formed in a forward-tapered shape.

Next, as illustrated in FIG. 7B, the manufacturing method of the semiconductor light emitting element 1 proceeds to etching the upper faces of the semiconductor blocks 19A and 19B to form the projections and depressions, for example, by wet etching Next, as illustrated in FIG. 7C, the manufacturing method of the semiconductor light emitting element 1 proceeds to etching the first protection film 18 in the center area, for example, by wet etching, so that the wiring pattern 17a is exposed. Next, as illustrated in FIG. 7D, the manufacturing method of the semiconductor light emitting element 1 proceeds to forming the external connectors 17c on the exposed area of the wiring pattern 17a.

Next, as illustrated in FIG. 7E, the manufacturing method of the semiconductor light emitting element 1 proceeds to forming the second protection film 21 on the upper and side faces of the semiconductor blocks 19A and 19B, for example, by means of sputtering. Lastly, as illustrated in FIG. 7F, the manufacturing method of the semiconductor light emitting element 1 proceeds to forming the back face adhesion layer 12 on the lower face of the substrate 11, for example, by means of sputtering. Through the above-mentioned steps, the semiconductor light emitting element 1 as illustrated in FIG. 1 can be manufactured.

EXAMPLES

Experimental examples for demonstrating the advantageous effects of the present invention will be described below. In the experiment, a semiconductor light emitting element including a semiconductor laminate divided by a groove (see FIG. 1), which is an example of the present invention, and a light emitting element without a groove (not shown), which is a comparative example, were prepared. Then, they were driven by predetermined electric current (350 mA in the experiment) to compare their light outputs Po.

In the measurement of their light outputs Po, the following results were obtained. The semiconductor light emitting element including the semiconductor laminate with the groove, which is an inventive example, exhibited a light output Po of approximately 643 mW. In contrast, the semiconductor light emitting element without a groove, which is a comparative example, exhibited a light output Po of approximately 632 mW. In this way, it was demonstrated that a groove on a semiconductor laminate increases the optical output Po of the semiconductor light emitting element. Explaining the increase in optical output, a possible mechanism is that the active layer is exposed due to dividing the semiconductor laminate by the groove, and this increases the amount of light emerging from the active layer.

While the semiconductor light emitting element of the present invention and the manufacturing method thereof are described in detail with the embodiment and example, the scope of the present invention is not limited by those descriptions but shall be broadly construed according to the recitation of the claims. Further, it is understood that various variations and modifications according to these descriptions are also included in the scope of the present invention.

For example, in the semiconductor light emitting element 1, a plating member may be formed on the semiconductor laminate 19 by plating, and it may be used as the substrate 11 or the substrate adhesion layer 13. Further, the semiconductor light emitting element 1 may not be provided with the substrate 11. For example, a semiconductor light emitting element 1 with no substrate 11 may be directly mounted on a mount or base of a light emitting device (not shown).

In the semiconductor light emitting element 1, the first protection film 18 serves as a light reflector as illustrated in FIG. 3. However, the first protection film 18 may not be provided, and the wiring pattern 17a may serve as a light reflector instead. In this case, the wiring pattern 17a does not have the opening that corresponds to the groove 22, and is exposed between the external connectors 17c. Further, it is preferred that the wiring pattern 17a contains a material selected from Ag, Pt, Rh, Al and Al alloy.

In the above-mentioned semiconductor light emitting element 1, the through holes 20, the protrusions 151 of the first electrode 15 and the projected openings 161 of the insulation film 16 are formed in an exactly round shape in a plan view as illustrated in FIG. 1. However, their shapes in a plan view are not limited to an exact circle, and may be any shape including oval, polygonal, linear and curved shapes. In addition, the shapes may be different from each other. Further, the through holes 20, protrusions 151 and projected openings 161 may be formed in a shape like a combination of plural pieces. Since too small through holes 20, protrusions 151 and projected openings 161 may cause high forward voltage Vf, they may be formed in, for example, an oval or linear shape whose area is slightly larger than that of the exactly round shape. If the through holes 20, protrusions 151 and projected openings 161 are formed in, for example, an oval shape, they may be placed in regular intervals according to the shape of the semiconductor laminate 19, which results in uniform light emission.

Figure 8:
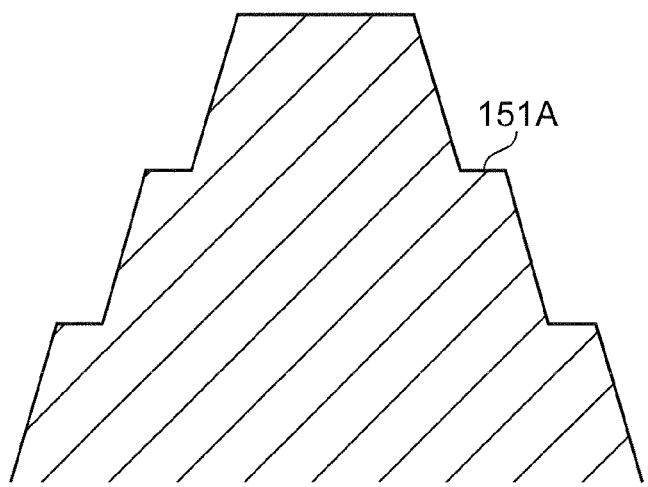
FIG. 8 is a schematic view for describing a first variation of the semiconductor light emitting element according to the first embodiment of the present invention.

In the above-mentioned semiconductor light emitting element 1, the protrusions 151 are formed in an approximately cone frustum shape as illustrated in FIG. 3, and do not have any steps, projections or depressions on the side faces. However, the word "approximately frustum shape" also includes a forward-tapered shape with steps (or projections and depressions) on the side face such as protrusions 151A illustrated in FIG. 8.

The size, number and position of the through holes 20, protrusions 151 and projected openings 161 are not particularly limited, and may be suitably adjusted according to the size and shape of the semiconductor laminate 19. For example, besides the arrangement in columns and rows as illustrated in FIG. 1, the through holes 20, protrusions 151 and projected openings 161 may be symmetrically arranged about a line or point or may be arranged in random intervals.

In the above-mentioned semiconductor light emitting element 1, the side faces of the semiconductor blocks 19A and 19B are inclined in a forward-tapered shape as illustrated in FIG. 3. However, the side faces of the semiconductor blocks 19A and 19B may be inclined, for example, in an inverted tapered shape such that the first semiconductor layer 19a has larger area than the second semiconductor layer 19b. In a semiconductor light emitting element 1 of this case, the light emerging from the active layer 19c can be reflected on the side faces (specifically, inside surfaces of the side faces) of the semiconductor blocks 19A and 19B so as to be extracted upward from the semiconductor blocks 19A and 19B.

In the above-mentioned semiconductor light emitting element 1, the side faces of the semiconductor blocks 19A and 19B are inclined in a forward tapered shape as illustrated in FIG. 3. However, they may not be inclined in a tapered shape.

Figure 9A:
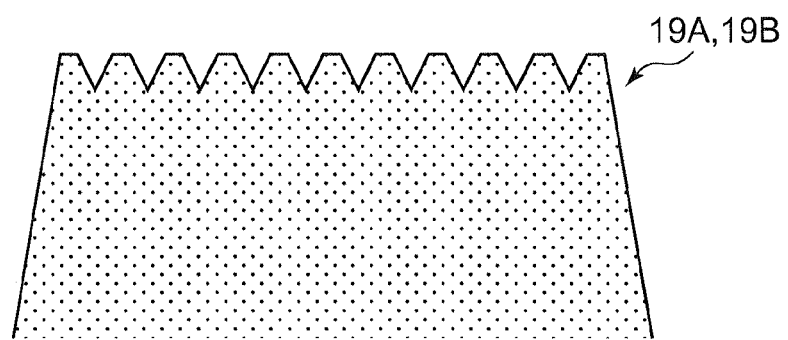
FIGS. 9A and 9B are schematic views for describing a second variation of the semiconductor light emitting element according to the first embodiment of the present invention.
Figure 9B:
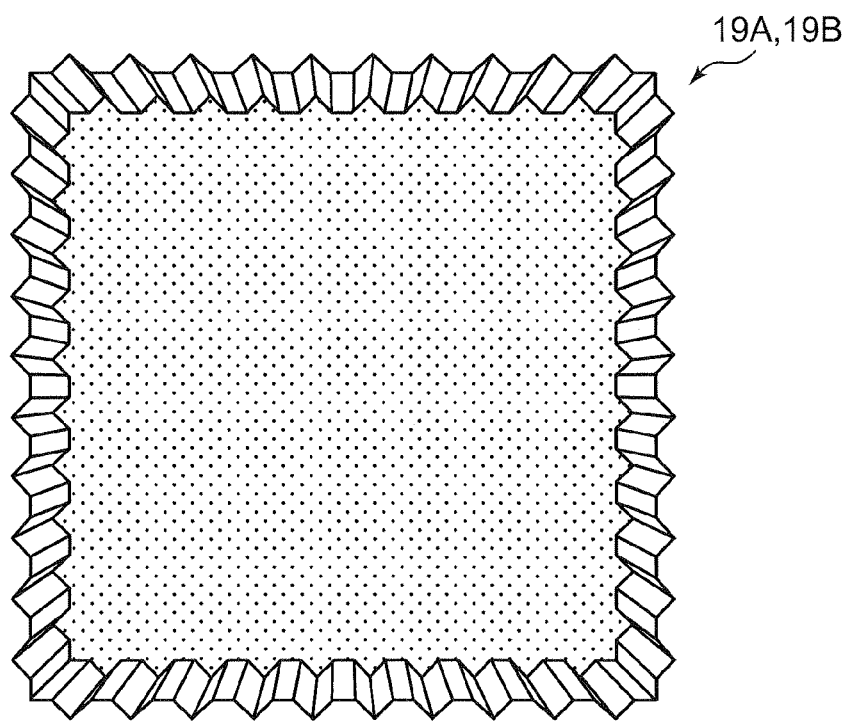

In the above-mentioned semiconductor light emitting element 1, the semiconductor blocks 19A and 19B have the projections and depressions on the upper faces (upper face of the first semiconductor layer 19a) as illustrated in FIG. 3. However, it is more preferred that the side faces of the semiconductor blocks 19A and 19B are also processed to have projections and depressions in addition to the upper faces. Specifically, it is preferred that at least the opposite side faces of the semiconductor blocks 19A and 19B have projections and depressions. That is, in a semiconductor light emitting element 1 of this case, in addition to the upper faces of the semiconductor blocks 19A and 19B, the side faces of the semiconductor blocks 19A and 19B have projections and depressions in the circumferential direction as illustrated in FIGS. 9A and 9B. Specifically, the projections and depressions are alternately formed on the side faces of the semiconductor blocks 19A and 19B in the circumferential direction. Here, FIG. 9A is a side view of the semiconductor blocks 19A or 19B showing the vertical cross section thereof, and FIG. 9B is a top view of the semiconductor blocks 19A or 19B showing the horizontal cross section thereof. In the semiconductor light emitting element 1 of this case, the textured side faces of the semiconductor blocks 19A and 19B diffuse the light emerging from the active layer 19c before going out, which results in further improved light extraction efficiency. In FIGS. 9A and 9B, the second protection film 21 of the semiconductor light emitting element 1 is not shown (see FIG. 3).

Figure 10A:
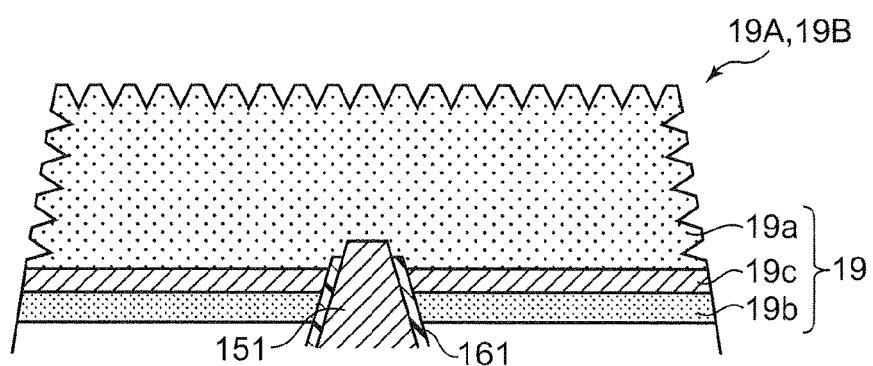
FIGS. 10A and 10B are schematic views for describing a third variation of the semiconductor light emitting element according to the first embodiment of the present invention.

Alternatively, in the semiconductor light emitting element 1, the side faces of the semiconductor blocks 19A and 19B may have projections and depressions in the vertical direction as illustrated in FIG. 10A in addition to the upper faces of the semiconductor blocks 19A and 19B. Specifically, in the semiconductor light emitting element 1 of FIG. 10A, the projections and depressions are alternately formed on the side faces of the semiconductor blocks 19A and 19B in the vertical direction. In the semiconductor light emitting element 1 of this case, the textured side faces of the semiconductor blocks 19A and 19B diffuse the light emerging from the active layer 19c better before going out, which results in further improved light extraction efficiency. In FIG. 10A, the second protection film 21 of the semiconductor light emitting element 1 is not shown (see FIG. 3).

Figure 10B:
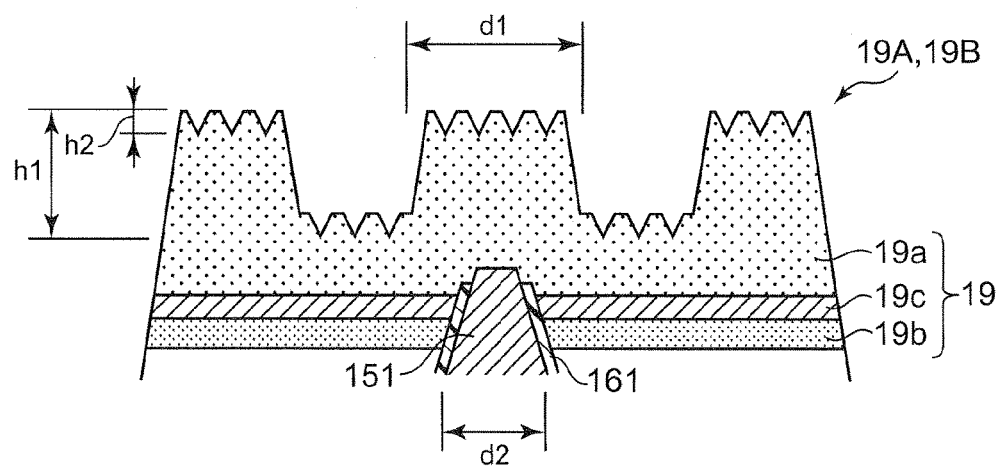

In the above-mentioned semiconductor light emitting element 1, the projections and depressions on the upper face of the first semiconductor layer 19a has the same height or depth as illustrated in FIG. 3. However, as illustrated in FIG. 10B for example, the first semiconductor layer 19a may have projections and depressions that are composed of a combination of large projections and depressions having a vertical interval h1 and small projections and depressions having a vertical interval h2. In the semiconductor light emitting element 1 of this case, the surface diffuses the light emerging from the active layer 19c in wider directions, which results in further improved light extraction efficiency.

In order not to interrupt diffusion of the electric current, if the first semiconductor layer 19a has the projections and depressions as illustrated in FIG. 10B, it is preferred that the protrusions 151 of the first electrode 15 and the projected openings 161 of the insulation film 16 are aligned with the projections having the vertical interval h1 as illustrated in the figure, and it is also preferred that the width d2 of the protrusions 151 of the first electrode 15 is shorter than the width d1 of the projections and depressions having the vertical interval h1.

Figure 11:
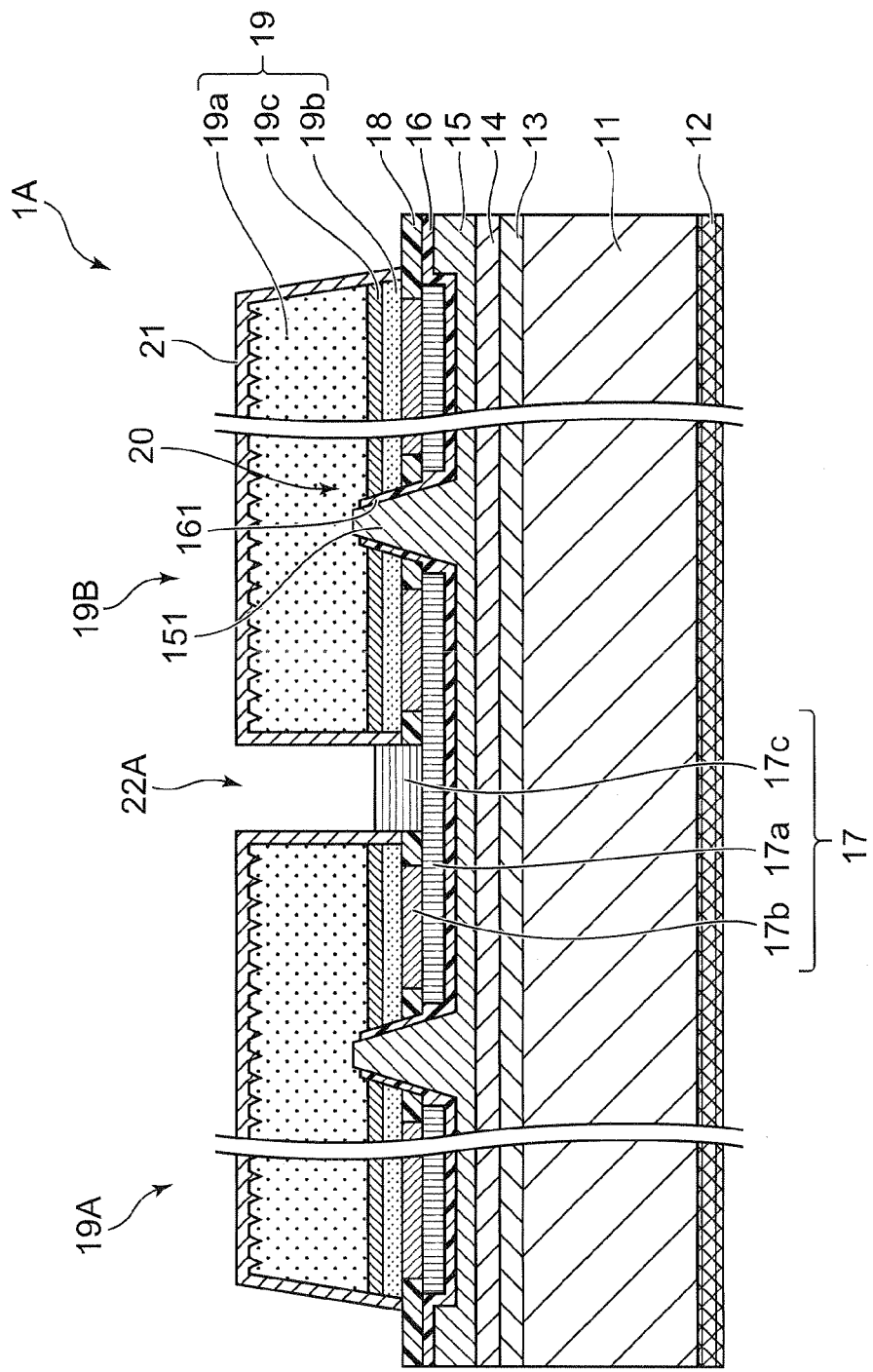
FIG. 11 is a schematic view for describing a fourth variation of the semiconductor light emitting element according to the first embodiment of the present invention.

In the above-mentioned semiconductor light emitting element 1, the opposite side faces of the semiconductor blocks 19A and 19B that define the groove 22 are inclined in a tapered shape as illustrated in FIG. 3. However, as illustrated in FIG. 11 for example, they may not be inclined in a tapered shape. That is, in a semiconductor light emitting element 1A of this variation, the opposite side faces of semiconductor blocks 19A and 19B that define a groove 22A stand vertically as illustrated in FIG. 11, and the groove 22A has a constant width in the vertical direction. As with the above-mentioned semiconductor light emitting element 1, in the semiconductor light emitting element 1A, this allows the light emerging from an active layer 19c to be easily emitted from the groove 22A, i.e. the opposing side faces of the semiconductor blocks 19A and 19B, which results in improved light extraction efficiency comparing to an semiconductor laminate 19 that is not provided with this groove 22A.

Second Embodiment

Structure of Semiconductor Light Emitting Element

A semiconductor light emitting element 2 according to a second embodiment of the present invention will be described with reference to FIGS. 12 and 13.

The semiconductor light emitting element 2 is different from the semiconductor light emitting element 1 of the first embodiment in that it includes a single semiconductor laminate 19 that is not divided by a groove, and the semiconductor laminate 19 is provided with holes 22 for extracting light.

In the semiconductor light emitting element 2 of the second embodiment, the semiconductor laminate 19 has the same laminate structure with that of the first embodiment except that it is not divided by a groove. That is, as illustrated in FIG. 13, the semiconductor light emitting element 2 includes a substrate 11 with a back face adhesion layer 12 on the lower face thereof, and further includes a substrate adhesion layer 13, a first electrode adhesion layer 14, a first electrode 15, an insulation film 16, a second electrode 17, a first protection film 18, a semiconductor laminate 19 and a second protection film 21 that are laminated on the substrate 11. Further, the semiconductor light emitting element 2 has the following appearance.

Figure 12:
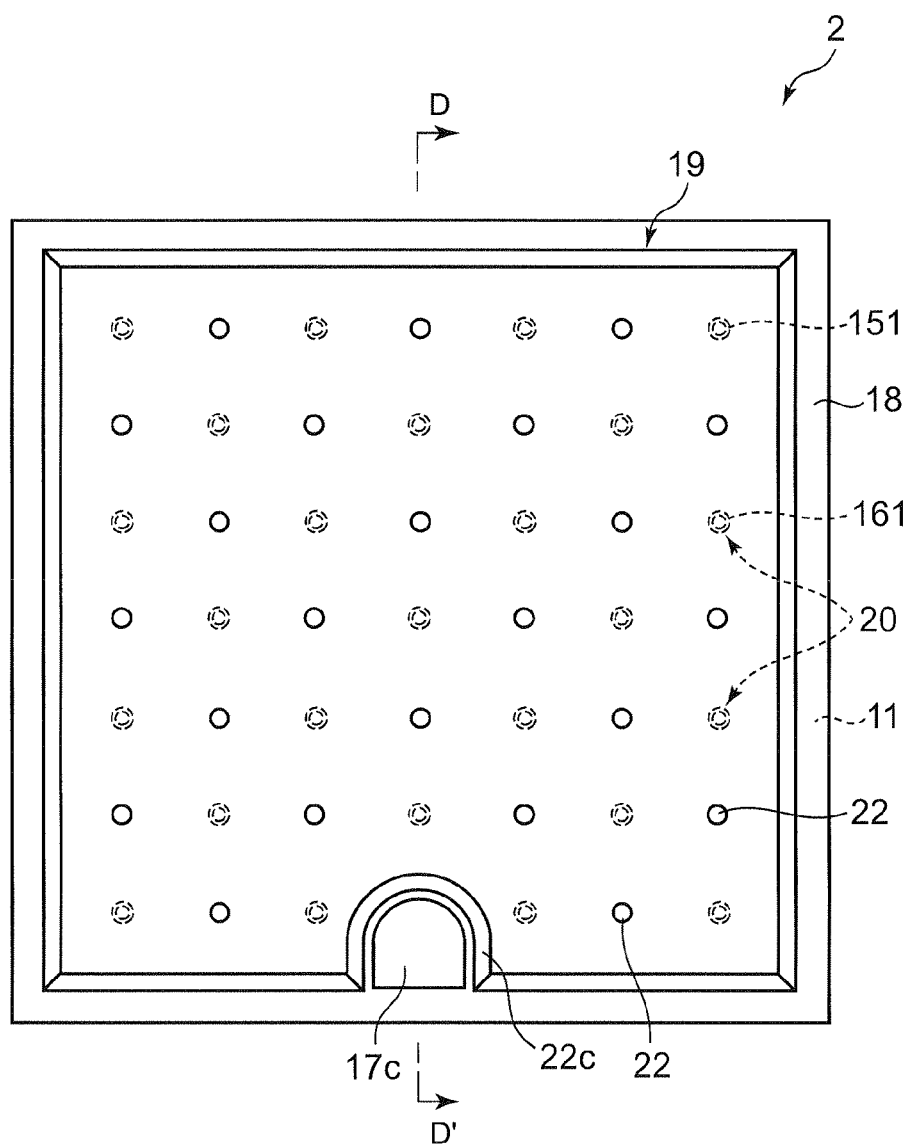
FIG. 12 is a plan view illustrating the overall structure of a semiconductor light emitting element according to a second embodiment of the present invention.

In a plan view as illustrated in FIG. 12, the semiconductor light emitting element 2 is formed in an approximately rectangular shape. Further, as illustrated in FIG. 13, the upper portion of the semiconductor light emitting element 2 has an approximately trapezoidal cross section, and is provided with holes 23 that penetrate the semiconductor laminate 19 at predetermined positions. As illustrated in FIG. 13, the semiconductor light emitting element 2 has a shape of a combination of a flat plate shape of a predetermined thickness and an approximate frustum of pyramid mounted thereon. On the approximately trapezoidal upper portion of the semiconductor light emitting element 2, a cutout 22c is formed as illustrated in FIGS. 12 and 13, and an external electrode 17c of a second electrode 17 is formed in the cutout 22c. The cutout 22c is formed on the center of one of the side faces of the semiconductor laminate 19.

Figure 13:
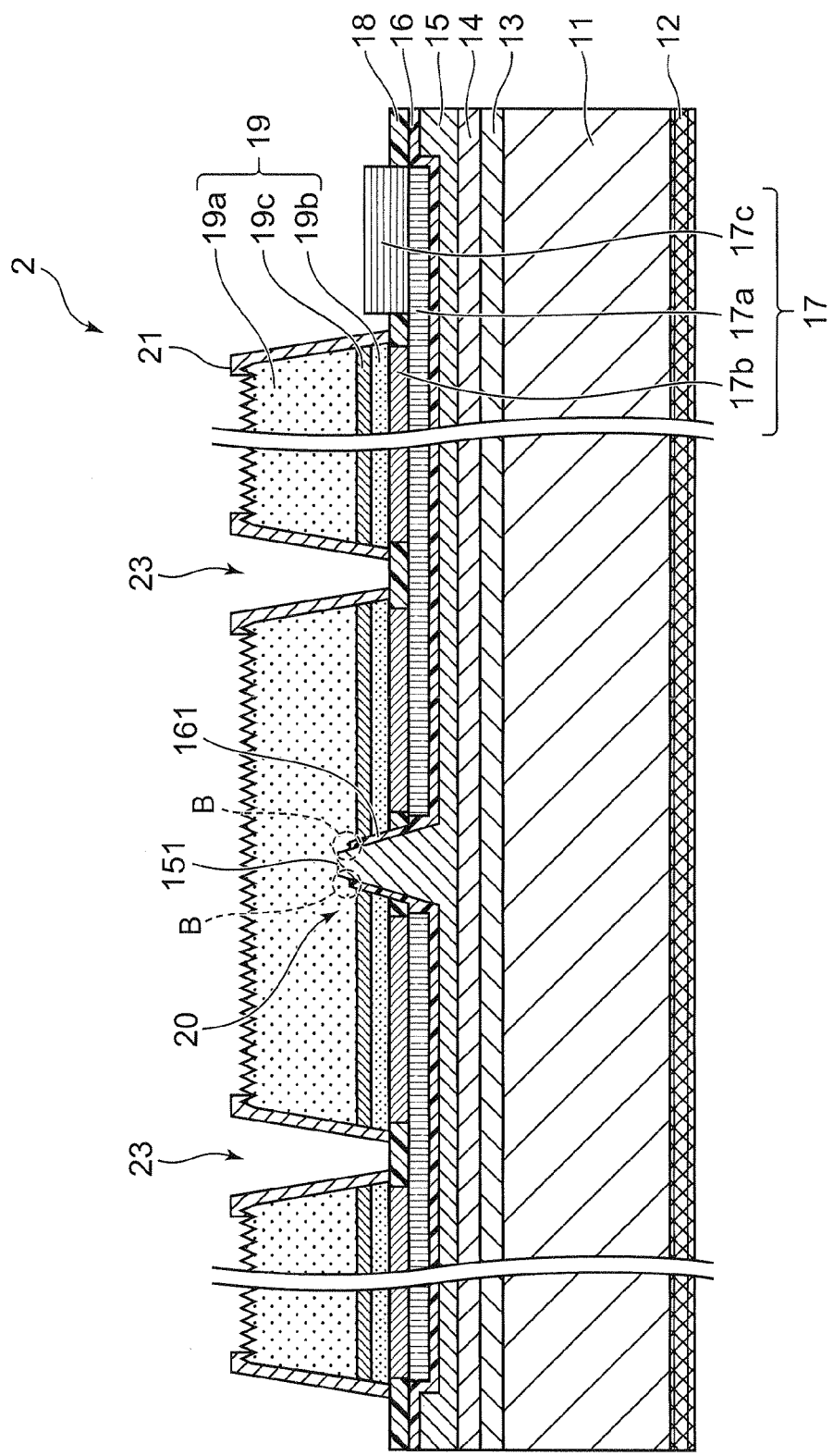
FIG. 13 is a perspective partially-cutaway view illustrating the overall structure of the semiconductor light emitting element according to the second embodiment of the present invention, i.e. a cross sectional view taken along line D-D' of FIG. 12.

While FIG. 13 is a cross sectional view along the D-D' of FIG. 12, it illustrates only two of three holes 23 that are supposed to appear on the D-D' cross sectional face of FIG. 12 for descriptive reasons. Similarly, FIG. 13 only illustrates one of the three protrusions 151 of the first electrode 15 and one of three projected openings 161 of the insulation film 16 that appear on the D-D' cross section.

Hereinafter, the semiconductor light emitting element 2 of the second embodiment will be described in regard to the components that are different from those of the semiconductor light emitting element 1 of the first embodiment.

As with the first embodiment, the second electrode 17 includes the external connector 17c, an internal connector 17b and a wiring pattern 17a connected to each other.
(External Connector 17c)

The external connector 17c is formed on the wiring pattern 17a that extends out from under the second semiconductor layer 19b to the outside of the semiconductor laminate 19.

That is, as illustrated in FIG. 13, the wiring pattern 17a is formed on almost the entire lower face of the second semiconductor layer 19b except for the areas of the projected openings 161 of the insulation film 16. The wiring pattern 17a is also formed on the area inside the cutout 22c where the second semiconductor layer 19b is removed. The external connector 17c is formed on the part of the wiring pattern 17a that is exposed on the inside of the cutout 22c.

As illustrated in FIG. 12, the external connector 17c is exposed from the first protection film 18 above the substrate 11. That is, as illustrated in FIG. 13, the external connector 17c is provided on the wiring pattern 17a inside the cutout 22c, and penetrates the first protection film 18.

It is preferred that the external connector 17c is provided at a position other than the corners of the semiconductor light emitting element 2. In the embodiment, it is placed on the center of one of side faces of the semiconductor laminate 19 as illustrated in FIGS. 12 and 13. It is also preferred to provide a plurality of external connectors 17c, for example at opposite positions across the semiconductor laminate 19. For example, one external connector 17c is placed on the center of one of the side faces of the semiconductor laminate 19, and another external connector is placed on the center of the opposite side face at the center thereof. That is, it is preferred that the plurality of external connectors 17c are provided on the first protection film 18 above the substrate 11 on side faces of the semiconductor laminate 19 except for the corners thereof, and that they are placed on the opposite side faces of the semiconductor laminate 19 except for the corners thereof. This allows for uniform electric current injection to the semiconductor laminate 19.

Further, as illustrated in FIG. 12, it is preferred that the external connector 17c is exposed in the peripheral area of the semiconductor laminate 19, i.e. in an area other than the center area. This makes it possible to place a conductive wire (not shown) connected to the external connector 17c away from above the element, which reduces the light absorption by the conductive wire, and thereby results in improved light output.

As illustrated in FIG. 12, the external connector 17c is formed in a half-round shape, and as illustrated in FIG. 13, has a predetermined height from the first protection film 18. Further, although not shown in the figures, the external connector 17c has a bump to be connected to an external power source through a conductive wire or the like on its upper face.
(Holes 23)

As illustrated in FIG. 13, the semiconductor laminate 19 is provided with a plurality of the holes 23 that penetrate the first semiconductor layer 19a, active layer 19c and second semiconductor layer 19b. By forming the holes 23, the active layer 19c is exposed in the holes 23 as illustrated in FIG. 13. Specifically, the bottoms of the holes 23 are the upper face of the first protection film 18 as illustrated in FIG. 13. The first protection film 18 on the bottoms of the holes 23 is preferably made of light reflecting material. In the semiconductor light emitting element 2, even if the light emerging from the active layer 19c is emitted from the inner circumferential faces of the holes 23 toward the bottoms of the holes 23 for example, such light is reflected by the first protection film 18. This results in improved light extraction efficiency.

The holes 23 have exactly circular openings in a plan view as illustrated in FIG. 12, and the semiconductor laminate 19 is provided with 23 pieces of the holes 23. The number and size (area) of the holes 23 may be suitably adjusted considering the balance between the increase in light output and the increase in drive voltage both of which are caused by the holes 23.

Instead of the round shape, the holes 23 may have a different cross-sectional shape such as polygonal shape as illustrated in FIG. 12. That is, in the semiconductor light emitting element 2, the semiconductor laminate 19 may be provided with the holes 23 having any cross-sectional shape according to desired properties. As used herein, the above "round shape or polygonal shape" includes not only an exactly round or polygonal shape but also includes round or polygonal shapes that have projections and depressions to the extent not losing the original round or polygonal shape.

As illustrated in FIG. 12, it is preferred that each of the holes 23 are placed on a line connecting two protrusions 151. It is more preferred that each of the holes 23 is placed at the same distance from the two protrusions 151. In the semiconductor light emitting element 2 of this case, the holes 23 are placed midways between the protrusions 151 where the electric current density and the emission intensity tend to be low comparing to the vicinities of the protrusions 151 of the first electrode 15 where electric current tends to be concentrated. This allows for extraction of light without substantial loss in the areas where the emission intensity tends to be low. As a result, the semiconductor light emitting element 2 of the second embodiment can exhibit further improved light extraction efficiency and more uniform emission distribution. Further, in a plan view as illustrated in FIG. 12, it is preferred that the holes 23 and the protrusions 151 of the first electrode 15 are alternately arranged in columns and rows above the substrate 11. That is, as illustrated in FIG. 12, the holes 23 are provided between the protrusions 151. Also in the semiconductor light emitting element 2 of this case, the holes 23 are placed in midways between the protrusions 151 where the electric current density and the emission intensity tend to be low comparing to the vicinities of the protrusions 151 of the first electrode 15 where electric current tends to be concentrated, which results in further improved light extraction efficiency and more uniform emission distribution. Further, by providing plural pieces of the holes 23, the semiconductor light emitting element having such structure exhibits improved light extraction efficiency. As used herein, the above "columns and rows" respectively refer to, if the semiconductor light emitting element 2 has a rectangular shape in a plan view as illustrated in FIG. 12 for example, two directions parallel to the sides of the semiconductor light emitting element 2. That is, the above "the holes 23 and the protrusions 151 are alternately arranged in columns and rows" means that the holes 23 and the protrusions 151 are alternately arrayed in both row and column directions.

It is preferred that the side faces of the semiconductor laminate 19 and the inner circumferential faces of the holes 23 are inclined in a tapered shape as illustrated in FIG. 13. Specifically, the side faces of the semiconductor laminate 19 and the inner circumferential faces of the holes 23 are inclined in a forward-tapered shape as illustrated in FIG. 13. In the semiconductor light emitting element 2, this allows the light emerging from the active layer 19c to be easily emitted from the tapered side faces of the semiconductor laminate 19 and the tapered inner circumferential faces of the holes 23, which results in improved light extraction efficiency.

As illustrated in FIG. 12, it is preferred that the holes 23 are placed around the external connector 17c in a plan view. In the semiconductor light emitting element 2, by placing the holes around the external connector 17c where electric current tends to be concentrated, the light is extracted from the area having the highest emission intensity, which results in improved light output.

While the semiconductor light emitting element 2 of the second embodiment is described in regard to the components different from those of the first embodiment, the substrate 11, the back face adhesion layer 12, the substrate adhesion layer 13, the first electrode adhesion layer 14, the first electrode 15, the insulation film 16 and the like are basically as same as those of the semiconductor light emitting element 1 of the first embodiment except for the number and arrangement of the protrusions 151.

In the semiconductor light emitting element 2 having the above structure, the holes 23 penetrating the semiconductor laminate 19 allow the active layer 19c to be exposed on the inner circumferential faces of the holes 23. As a result, the light is extracted through the holes 23. Further, in the semiconductor light emitting element 2, the part of the semiconductor laminate 19 that does not contribute to the light emission is minimized by providing the holes 23 instead of by dividing the semiconductor laminate 19 into a plurality of blocks for example. As a result, the light emitting area is maximized.

In conclusion, in the semiconductor light emitting element 2, the holes 23 is formed in the semiconductor laminate 19 to maximize the light emitting area, which improves the emission intensity and reduces the drive voltage and thereby results in improved luminous efficiency.

(Manufacturing Method of the Semiconductor Light Emitting Element 2)

Hereinafter, a manufacturing method of the semiconductor light emitting element 2 according to the second embodiment of the present invention will be described with reference to FIGS. 14 through 16 (see FIGS. 12 and 13 for the structure). As with FIG. 13, FIGS. 14 through 16 referenced below are cross sectional views taken along line D-D' of FIG. 12, but illustrate only two of the holes 23 and one of each of the through holes 20, the protrusions 151 of the first electrode 15 and the projected openings 161 of the insulation film 16, and the others are omitted.

Figure 14A:
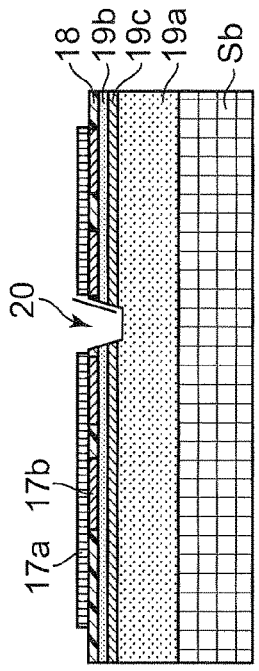
FIGS. 14A through 14F are schematic views illustrating a part of a manufacturing method of the semiconductor light emitting element according to the second embodiment of the present invention.
Figure 14B:
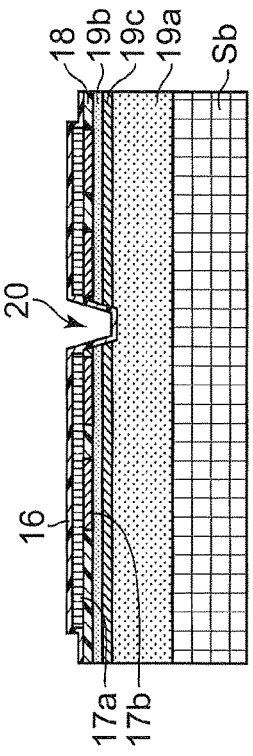
Figure 14C:
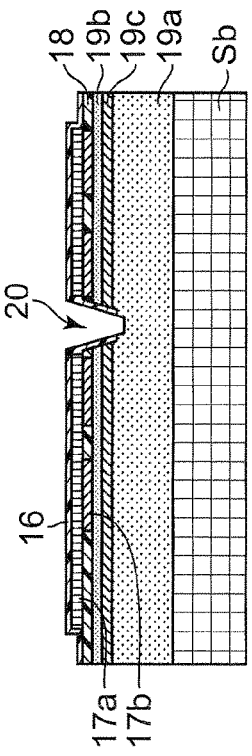

As illustrated in FIG. 14A, the manufacturing method of the semiconductor light emitting element 2 starts with forming the semiconductor laminate 19 composed of the first semiconductor layer 19a, active layer 19c and second semiconductor layer 19b on a sapphire substrate Sb by crystal growth, and then forming the internal connector 17b of the second electrode 17 on a predetermined area of the second semiconductor layer 19b, for example, by means of sputtering. Next, as illustrated in FIG. 14B, the manufacturing method of the semiconductor light emitting element 2 proceeds to forming the first protection film 18 between the internal connector 17b on the second semiconductor layer 19b, for example, by means of sputtering. Next, as illustrated in FIG. 14C, the manufacturing method of the semiconductor light emitting element 2 proceeds to forming the wiring pattern 17a on a predetermined area of the internal connectors 17b as well as first protection film 18, for example, by means of sputtering.

Figure 14D:
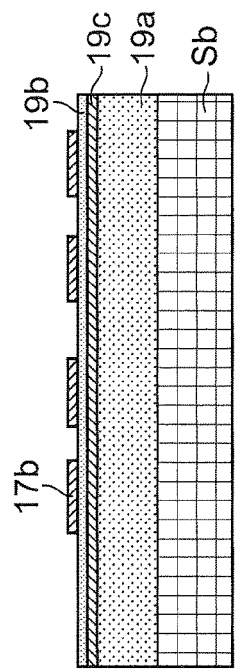
Figure 14E:
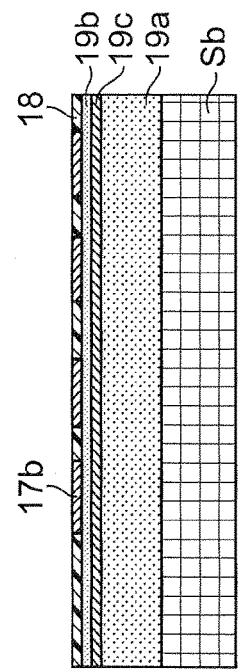
Figure 14F:
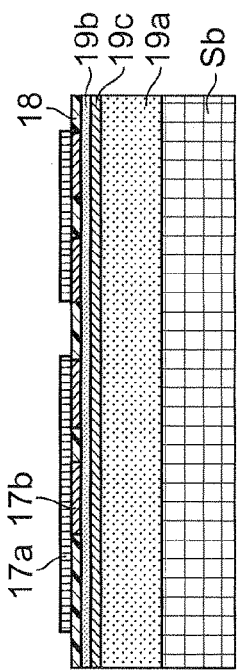

Next, as illustrated in FIG. 14D, the manufacturing method of the semiconductor light emitting element 2 proceeds to partially removing the first protection film 18, the second semiconductor layer 19b, the active layer 19c and the first semiconductor layer 19a, for example, by dry etching, so as to form the plurality of through holes 20. As mentioned above, the through holes 20 are to receive insertion of the protrusions 151 of the first electrode 15 and the projected openings 161 of the insulation film 16. Next, as illustrated in FIG. 14E, the manufacturing method of the semiconductor light emitting element 2 proceeds to forming the insulation film 16 on the wiring pattern 17a, on the first protection film 18 and in the through holes 20, for example, by sputtering. Next, as illustrated in FIG. 14F, the manufacturing method of the semiconductor light emitting element 2 proceeds to removing the insulation film 16 on the bottoms of the through holes 20 by a predetermined depth, for example, by means of dry etching, so that the first semiconductor layer 19a is exposed.

Next, as illustrated in FIG. 15A, the manufacturing method of the semiconductor light emitting element 2 proceeds to forming a comparatively thick layer of the first electrode 15 on the insulation film 16 and in the through holes 20, for example, by means of sputtering. Next, as illustrated in FIG. 15B, the manufacturing method of the semiconductor light emitting element 2 proceeds to flattening the first electrode 15 by polishing such as CMP (chemical mechanical polishing). Next, as illustrated in FIG. 15C, the manufacturing method of the semiconductor light emitting element 2 proceeds to forming the first electrode adhesion layer 14 on the flattened first electrode 15, for example, by means of sputtering.

Next, as illustrated in FIG. 15D, the manufacturing method of the semiconductor light emitting element 2 proceeds to preparing the substrate 11 with the substrate adhesion layer 13, and then, as illustrated in FIG. 15E, bonding the substrate adhesion layer 13 of the substrate 11 and the first electrode adhesion layer 14 to each other. Next, as illustrated in FIG. 15F, the manufacturing method of the semiconductor light emitting element 2 proceeds to irradiating the element with laser from the side of the sapphire substrate Sb according to the laser lift off method, so as to degrade the interface between the sapphire substrate Sb and the semiconductor laminate 19 (specifically, the first semiconductor layer 19a) to remove the sapphire substrate Sb.

Next, as illustrated in FIG. 16A, the manufacturing method of the semiconductor light emitting element 2 proceeds to etching the predetermined areas of the semiconductor laminate 19 until the first protection film 18 is exposed, for example, by dry etching, so as to form the plurality of holes 23 whose inner circumferential faces are inclined in a forward-tapered shape. At the same time, as illustrated in FIG. 16A, the peripheral area of the semiconductor laminate 19 is also etched until the first protection film 18 is exposed, so that the side faces of the semiconductor laminate 19 is formed in a forward-tapered shape.

Next, as illustrated in FIG. 16B, the manufacturing method of the semiconductor light emitting element 2 proceeds to etching the upper faces of the semiconductor laminate 19 to form projections and depressions, for example, by wet etching Next, as illustrated in FIG. 16C, the manufacturing method of the semiconductor light emitting element 2 proceeds to etching the part of the first protection film 18 exposed on the semiconductor laminate 19, for example, by wet etching, so that the wiring pattern 17a is exposed. Next, as illustrated in FIG. 16D, the manufacturing method of the semiconductor light emitting element 2 proceeds to forming the external connector 17c on the exposed area of the wiring pattern 17a.

Next, as illustrated in FIG. 16E, the manufacturing method of the semiconductor light emitting element 2 proceeds to forming the second protection film 21 on the side faces of the semiconductor laminate 19, for example, by means of sputtering. Then, as illustrated in FIG. 16F, the manufacturing method of the semiconductor light emitting element 2 proceeds to forming the back face adhesion layer 12 on the lower face of the substrate 11, for example, by means of sputtering. Through the above-mentioned steps, the semiconductor light emitting element 2 as illustrated in FIG. 12 can be manufactured.

Third Embodiment

Structure of Semiconductor Light Emitting Element

Figure 17:
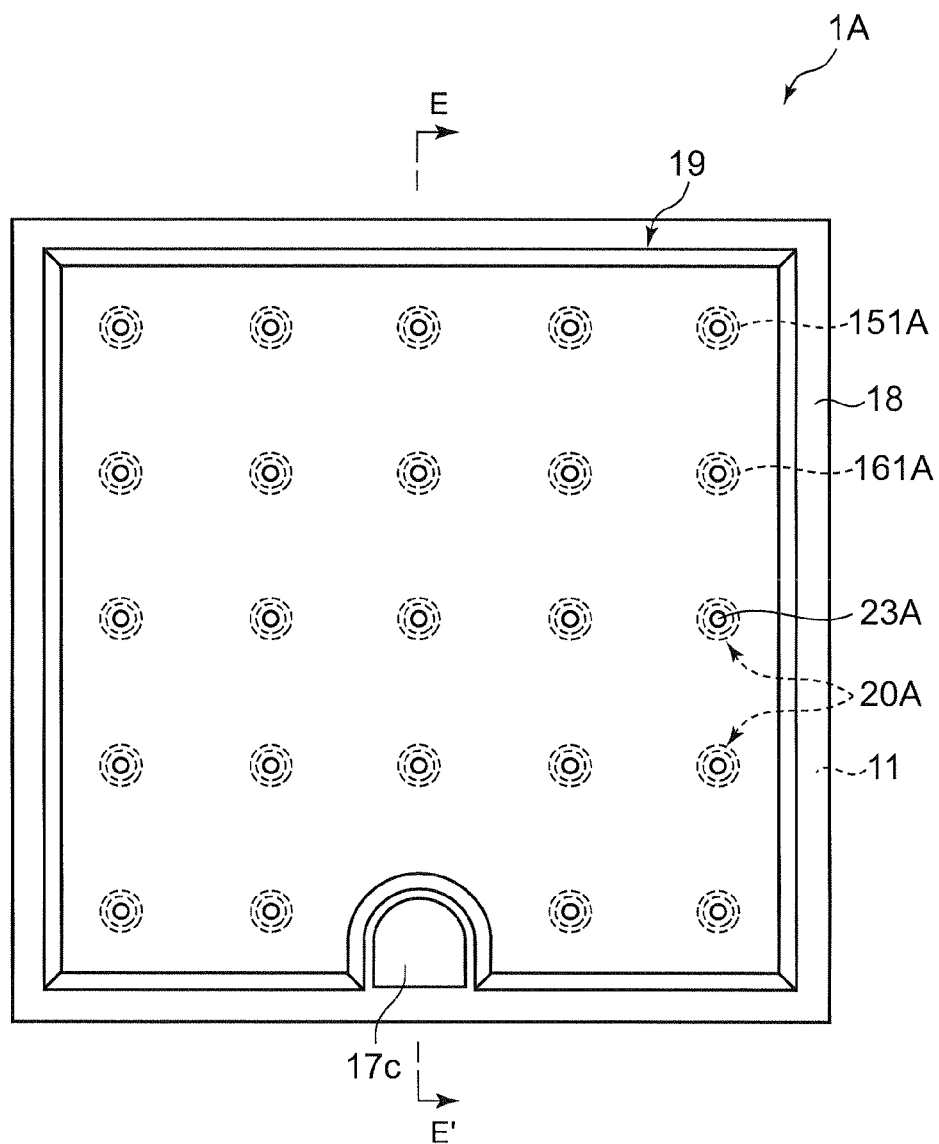
FIG. 17 is a plan view illustrating the overall structure of the semiconductor light emitting element according to a third embodiment of the present invention.
Figure 18:
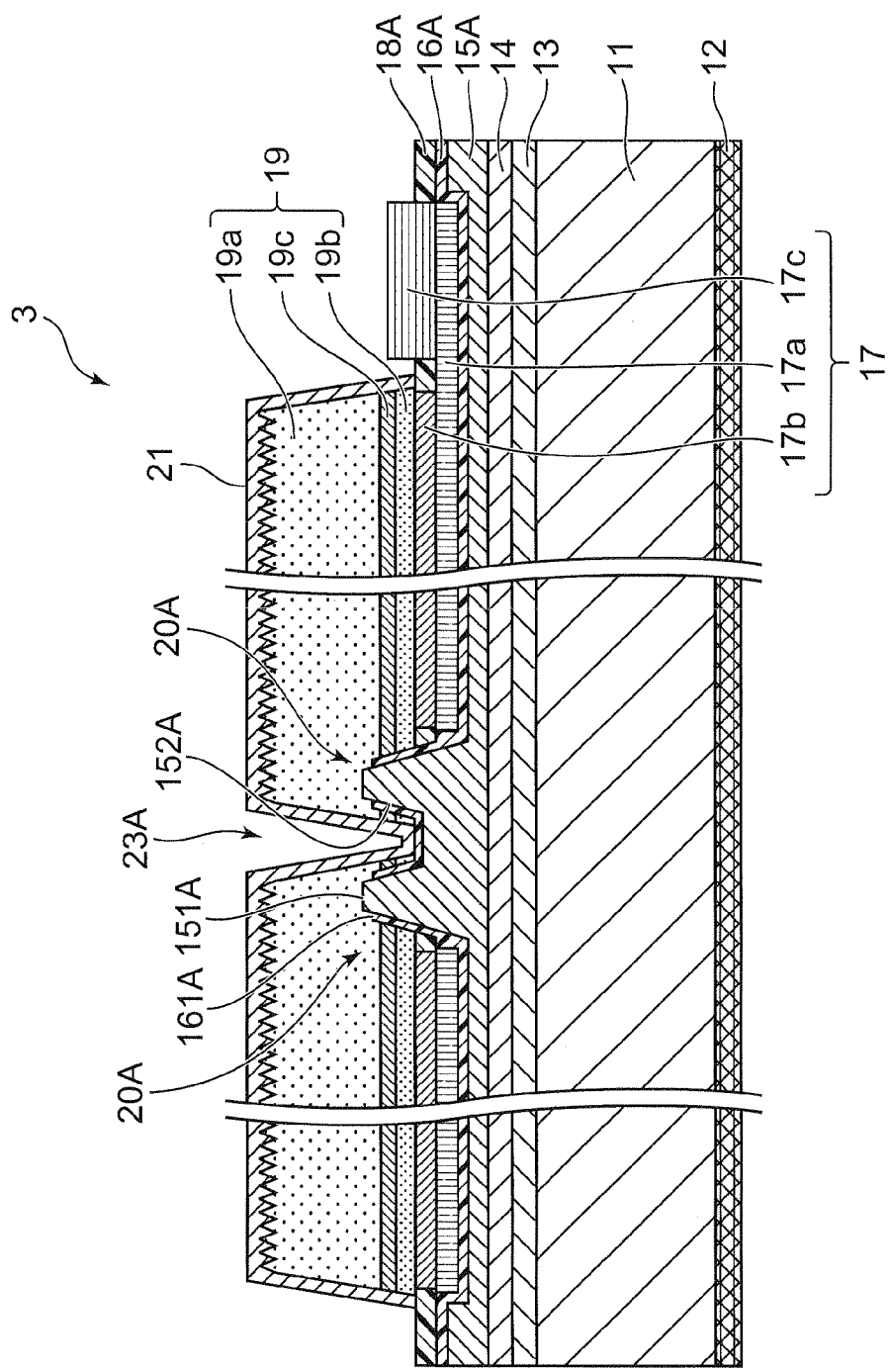
FIG. 18 is a perspective partially-cutaway view illustrating the overall structure of the semiconductor light emitting element according the third embodiment of the present invention, i.e. a cross sectional view taken along line E-E' of FIG. 17.

A semiconductor light emitting element 3 according to a third embodiment of the present invention will be described with reference to FIGS. 17 and 18. As illustrated in FIGS. 17 and 18, the semiconductor light emitting element 3 includes the same components as the above-mentioned semiconductor light emitting element 2 of the second embodiment except for holes 23A, protrusions 151A of a first electrode 15A and projected openings 161A of an insulation film 16A. In the following description, the same components as those of the above-mentioned semiconductor light emitting element 2 will be omitted. While FIG. 18 is a cross-sectional view taken along line E-E' of FIG. 17, it illustrates only one of four through holes 20A that are supposed to appear on the D-D' section. Similarly, FIG. 17 illustrates one of each of four holes 23A, four protrusions 151A of the first electrode 15A and four projected openings 161A of the insulation film 16A.

As a feature of the semiconductor light emitting element 3, the holes 23A and the protrusions 151A of the first electrode 15A are provided at the same positions above the substrate 11 in a plan view as illustrated in FIGS. 17 and 18. That is, the holes 23A and the protrusions 151A of the first electrode 15A are provided at the same positions in a plan view. As seen in a cross section of FIG. 18, the protrusions 151A of the first electrode 15A are formed in an approximately conical shape, and have recesses 152A at the center. Further, as illustrated in FIG. 18, the rims of the recesses 152A of the protrusions 151 project in a cylindrical shape, and the tips of the cylinders are in contact with the first semiconductor layer 19a around the holes 23A.

As illustrated in FIG. 17, the protrusions 151A are formed in an exactly round shape in a plan view, and there are 25 pieces of protrusions 151A in the lower portion of the semiconductor laminate 19. Accordingly, the first electrode 15A and the semiconductor laminate 19 are connected to each other at 25 spots. As illustrated in FIG. 17, the protrusions 151A are arranged in a quadrangular (square) grid pattern.

Meanwhile, as illustrated in FIG. 17, each of the holes 23A has an exactly circular opening in a plan view, and there are 25 pieces of the holes 23A in the semiconductor laminate 19. Further, as illustrated in FIG. 17, the holes 23A are arranged in a quadrangular (square) grid pattern as with the protrusions 151A, and are provided by the same number at the same positions with the protrusions 151A. Accordingly, as illustrated in FIG. 18, the holes 23A and the protrusions 151A are positioned such that the centers of the holes 23A are coincide with the centers of the recesses 152A of the respective protrusions 151A, and the bottoms of the holes 23A are located inside the respective recesses 152A. As illustrated in FIG. 18, the projected openings 161A of the insulation film 16A are formed on the side faces of the protrusions 151A as well as in the recesses 152A In conclusion, the semiconductor light emitting element 3 having the above-mentioned structure includes the holes 23A that are formed above first electrode 15A where electric current tends to be concentrated. This allows uniform diffusion of electric current and proactive extraction of the light from the areas around the first electrode 15A where the emission intensity is relatively high, which results in improved light output. Further, in the semiconductor light emitting element 3, since the holes 23A are formed on the first electrode 15A, it is not required to remove an unnecessarily large part of the active layer comparing to the case where a semiconductor laminate is divided by a groove or the like for example, which reduces the decrease in light output caused by the holes 23A.

(Manufacturing Method of Semiconductor Light Emitting Element)

Hereinafter, a manufacturing method of a semiconductor light emitting element 3 according to a third embodiment of the present invention will be described with reference to FIGS. 19 through 21 (see FIGS. 17 and 18 for the structure). As with the above-mentioned FIG. 18, FIGS. 19 through 21 referenced below are cross sectional views corresponding to the cross section along the line D-D' of FIG. 17, but illustrate only one of each of the holes 23A, the through holes 20A, the protrusions 151A of the first electrode 15A and the projected openings 161A of the insulation film 16A, and the others are omitted.

As illustrated in FIG. 19A, the manufacturing method of the semiconductor light emitting element 3 starts with forming the semiconductor laminate 19 composed of the first semiconductor layer 19a, active layer 19c and second semiconductor layer 19b on a sapphire substrate Sb by crystal growth, and then forming the internal connector 17b of the second electrode 17 on a predetermined area of the second semiconductor layer 19b, for example, by means of sputtering. Next, as illustrated in FIG. 19B, the manufacturing method of the semiconductor light emitting element 3 proceeds to forming the first protection film 18A between the internal connector 17b on the second semiconductor layer 19b, for example, by means of sputtering. Next, as illustrated in FIG. 19C, the manufacturing method of the semiconductor light emitting element 3 proceeds to forming the wiring pattern 17a on a predetermined area of the internal connectors 17b as well as first protection film 18A, for example, by means of sputtering.

Next, as illustrated in FIG. 19D, the manufacturing method of the semiconductor light emitting element 3 proceeds to partially removing the first protection film 18A, the second semiconductor layer 19b, the active layer 19c and the first semiconductor layer 19a, for example, by dry etching, so as to form the plurality of through holes 20A. Next, as illustrated in FIG. 19E, the manufacturing method of the semiconductor light emitting element 3 proceeds to forming the insulation film 16A on the wiring pattern 17a, on the first protection film 18A and in the through holes 20A, for example, by sputtering. Next, as illustrated in FIG. 19F, the manufacturing method of the semiconductor light emitting element 3 proceeds to removing the insulation film 16A on the bottoms of the through holes 20A by a predetermined depth, for example, by means of dry etching, so that the first semiconductor layer 19a is exposed.

Next, as illustrated in FIG. 20A, the manufacturing method of the semiconductor light emitting element 3 proceeds to forming a comparatively thick layer of the first electrode 15A on the insulation film 16A and in the through holes 20A, for example, by means of sputtering. Next, as illustrated in FIG. 20B, the manufacturing method of the semiconductor light emitting element 3 proceeds to flattening the first electrode 15A by polishing such as CMP (chemical mechanical polishing). Next, as illustrated in FIG. 20C, the manufacturing method of the semiconductor light emitting element 3 proceeds to forming the first electrode adhesion layer 14 on the flattened first electrode 15A, for example, by means of sputtering.

Next, as illustrated in FIG. 20D, the manufacturing method of the semiconductor light emitting element 3 proceeds to preparing the substrate 11 with the substrate adhesion layer 13, and then, as illustrated in FIG. 20E, bonding the substrate adhesion layer 13 of the substrate 11 and the first electrode adhesion layer 14 to each other. Next, as illustrated in FIG. 20F, the manufacturing method of the semiconductor light emitting element 3 proceeds to irradiating the element with laser from the side of the sapphire substrate Sb according to the laser lift off method, so as to degrade the interface between the sapphire substrate Sb and the semiconductor laminate 19 (specifically, the first semiconductor layer 19a) to remove the sapphire substrate Sb.

Next, as illustrated in FIG. 21A, the manufacturing method of the semiconductor light emitting element 3 proceeds to etching the predetermined areas of the semiconductor laminate 19 until the first protection film 18A is exposed, for example, by dry etching, so as to form the plurality of holes 23A whose inner circumferential faces are inclined in a forward-tapered shape. At the same time, as illustrated in FIG. 21A, the peripheral area of the semiconductor laminate 19 is also etched until the first protection film 18A is exposed, so that the side faces of the semiconductor laminate 19 is formed in a forward-tapered shape.

Next, as illustrated in FIG. 21B, the manufacturing method of the semiconductor light emitting element 3 proceeds to etching the upper faces of the semiconductor laminate 19 to form the projections and depressions, for example, by wet etching Next, as illustrated in FIG. 21C, the manufacturing method of the semiconductor light emitting element 3 proceeds to etching the part of the first protection film 18A exposed on the semiconductor laminate 19, for example, by wet etching, so that the wiring pattern 17a is exposed. Next, as illustrated in FIG. 21D, the manufacturing method of the semiconductor light emitting element 3 proceeds to forming the external connector 17c on the exposed area of the wiring pattern 17a.

Next, as illustrated in FIG. 21E, the manufacturing method of the semiconductor light emitting element 3 proceeds to forming the second protection film 21 on the upper and side faces of the semiconductor laminate 19, for example, by means of sputtering. Then, as illustrated in FIG. 21F, the manufacturing method of the semiconductor light emitting element 3 proceeds to forming the back face adhesion layer 12 on the lower face of the substrate 11, for example, by means of sputtering. Through the above-mentioned steps, the semiconductor light emitting element 3 as illustrated in FIG. 17 can be manufactured.

While the semiconductor light emitting elements of the present invention and the manufacturing methods thereof are described with the embodiments and examples, the scope of the present invention is not limited to those descriptions, and shall be broadly construed based on the recitation of the claims. Further, it is understood that various variations and modifications according to these descriptions are also included in the scope of the present invention.

Figure 22:
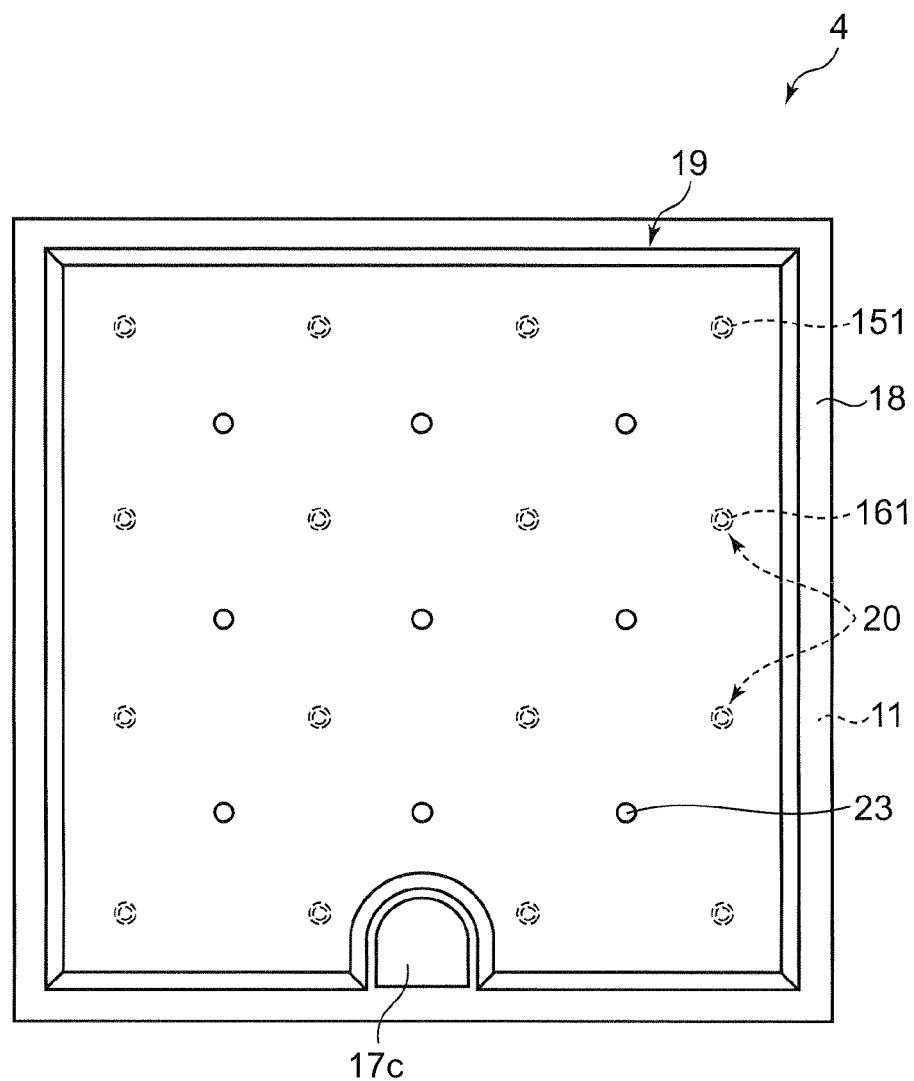
FIG. 22 is a plan view illustrating a semiconductor light emitting element according to a fourth embodiment of the present invention.

For example, in the above-mentioned semiconductor light emitting element 2, the holes 23 and protrusions 151 are alternately arranged in columns and rows in a plan view above the substrate 11 as illustrated in FIG. 12. However, the holes 23 and protrusions 151 may be alternately arranged diagonally as illustrated in FIG. 22. That is, in a semiconductor light emitting element 4 of FIG. 22, holes 23 and protrusions 151 are each separately arranged in a in a quadrangular grid pattern where the holes 23 are not aligned with the protrusions 151 in both top-bottom and left-right directions. In the diagonal directions, however, the holes 23 and protrusions 151 are alternately aligned in a semiconductor light emitting element 4. As with the above-mentioned semiconductor light emitting element 2, in the semiconductor light emitting element 4, the holes 23 are placed in the middle areas between the protrusions 151 where the electric current density and the emission intensity tend to be low comparing to the vicinities of the protrusions 151 of the first electrode 15 where electric current tends to be concentrated, which results in further improved light extraction efficiency and more uniform emission distribution. Further, by providing plural pieces of the holes 23, the semiconductor light emitting element having such structure exhibits improved light extraction efficiency. As used herein, the above "diagonal directions" refer to, if the semiconductor light emitting element 4 has a rectangular shape in a plan view as illustrated in FIG. 22 for example, the directions along the diagonal lines of the semiconductor light emitting element 4.

In the above-mentioned semiconductor light emitting elements 2 and 3, a plating member may be formed on the semiconductor laminate 19 by plating, and it may be used as the substrate 11 or the substrate adhesion layer 13. Further, the semiconductor light emitting element 2 may not be provided with the substrate 11. For example, a semiconductor light emitting element 2 with no substrate 11 may be directly mounted on a mount or base of a light emitting device (not shown).

In the above-mentioned semiconductor light emitting elements 2 and 3, the through holes 20 or 20A, the protrusions 151 or 151A of the first electrode 15 or 15A and the projected openings 161 or 161A of the insulation film 16 or 16A are formed in an exactly round shape in a plan view as illustrated in FIG. 12 or 17. However, their shapes in a plan view are not limited to an exact circle, and may be any shape including oval, polygonal, linear and curved shapes. In addition, the shapes may be different from each other. Further, the through holes 20 or 20A, the protrusions 151 or 151A and the projected openings 161 or 161A may be formed in a shape like a combination of plural pieces. Since too small through holes 20 or 20A, protrusions 151 or 151A and projected openings 161 or 161A may cause high forward voltage Vf, they may be formed in, for example, an oval or linear shape whose area is slightly larger than that of the exactly round shape. If the through holes 20 or 20A, the protrusions 151 or 151A and the projected openings 161 or 161A are formed in, for example, an oval shape, they may be placed in regular intervals according to the shape of the semiconductor laminate 19, which results in uniform light emission.

Figure 23:
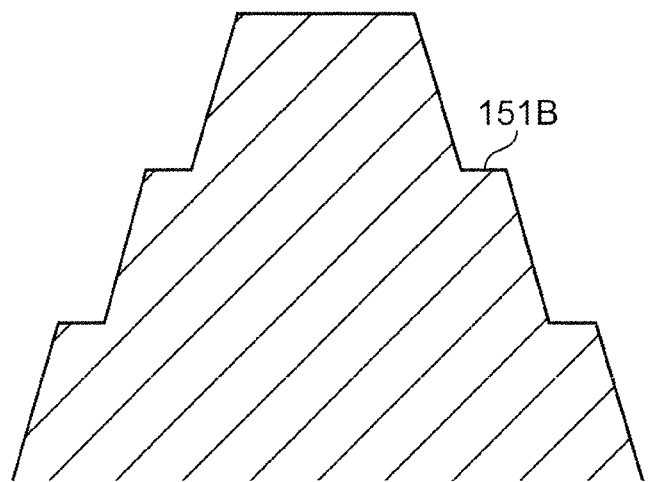
FIG. 23 is a schematic view for describing a first variation of the semiconductor light emitting element according to the embodiments of the present invention.

In the above-mentioned semiconductor light emitting element 2, the protrusions 151 are formed in an approximately cone frustum shape, and do not have any steps, projections or depressions on the side faces as illustrated in FIG. 13. However, the word "approximately frustum shape" also includes a forward-tapered shape with steps (or projections and depressions) on the side face such as protrusions 151B illustrated in FIG. 23.

The size, number and position of the through holes 20 or 20A, protrusions 151 or 151A and projected openings 161 or 161A are not particularly limited, and may be suitably adjusted according to the size and shape of the semiconductor laminate 19. For example, besides the arrangements illustrated in FIGS. 12 and 17, the through holes 20 or 20A, protrusions 151 or 151A and projected openings 161 or 161A may be symmetrically arranged about a line or point or may be arranged in random intervals.

In the above-mentioned semiconductor light emitting elements 2 and 3, the side faces of the semiconductor laminate 19 and the inner circumferential faces of the holes 23 or 23A are inclined in a forward-tapered shape as illustrated in FIGS. 13 and 18. However, the side faces of the semiconductor laminate 19 may be inclined in an inverted tapered shape. In a semiconductor light emitting elements 2 and 3 of this case, the side faces (specifically, inner side faces) of the semiconductor laminate 19 and the inner circumferential faces of the holes 23 or 23A can reflect the light emerging from the active layer 19c so as to extract it from the upper portion of the semiconductor light emitting elements 2 and 3.

In the above-mentioned semiconductor light emitting elements 2 and 3, the side faces of the semiconductor laminate 19 and the inner circumferential faces of the holes 23 or 23A are inclined in a forward tapered shape as illustrated in FIGS. 13 and 18. However, they may not be inclined in a tapered shape.

Figure 24A:
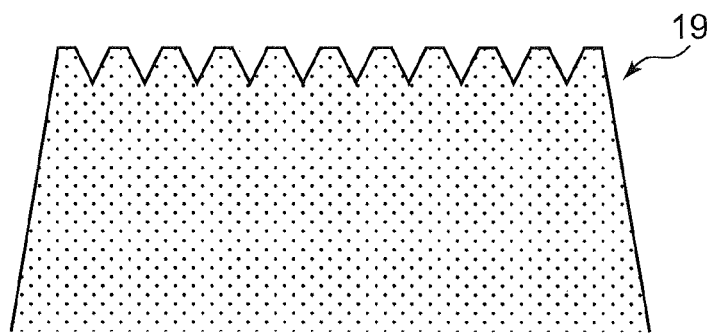
FIGS. 24A and 24B are schematic views for describing a second variation of the semiconductor light emitting element according to the embodiments of the present invention.
Figure 24B:
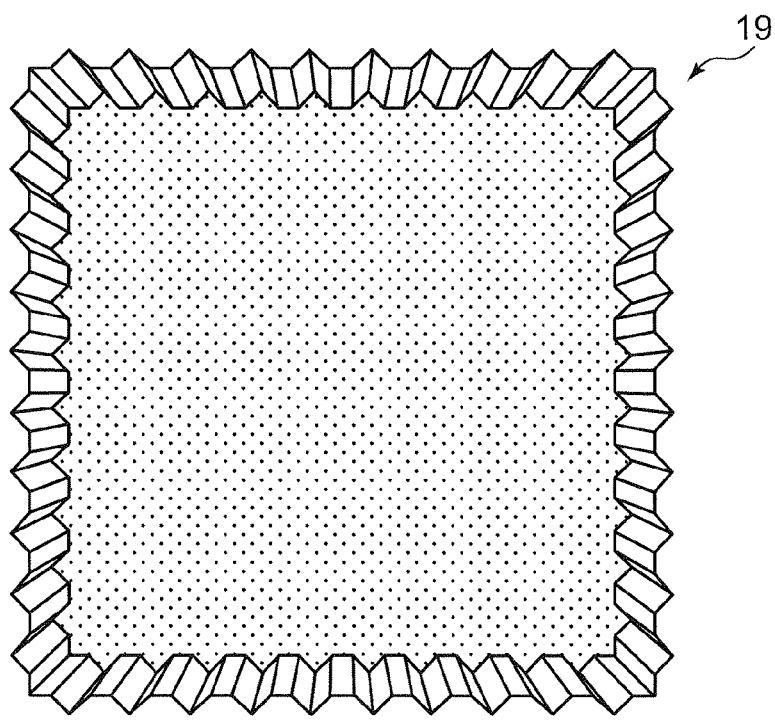

In the above-mentioned semiconductor light emitting elements 2 and 3, the semiconductor laminate 19 have the projections and depressions on the upper faces (upper face of the first semiconductor layer 19a) as illustrated in FIGS. 13 and 18. However, it is more preferred that the side faces of the semiconductor laminate 19 are also processed to have projections and depressions in addition to the upper faces. That is, in addition to the upper faces of the semiconductor laminate 19, in a semiconductor light emitting element 2 of this case, the side faces of the semiconductor laminate 19 have projections and depressions in the circumferential direction as illustrated in FIGS. 24A and 24B. Specifically, the projections and depressions are alternately formed on the side faces of the semiconductor laminate 19 in the circumferential direction. Here, FIG. 24A is a side view the semiconductor laminate 19 showing the vertical cross section thereof, and FIG. 24B is a top view of the semiconductor laminate 19 showing the horizontal cross section thereof. In the semiconductor light emitting elements 2 and 3 of this case, the textured side faces of the semiconductor laminate 19 diffuse the light emerging from the active layer 19c before going out, which results in further improved light extraction efficiency. In FIGS. 24A and 24B, the second protection film 21 of the semiconductor light emitting elements 2 and 3 is not shown (see FIGS. 13 and 18).

Figure 25A:
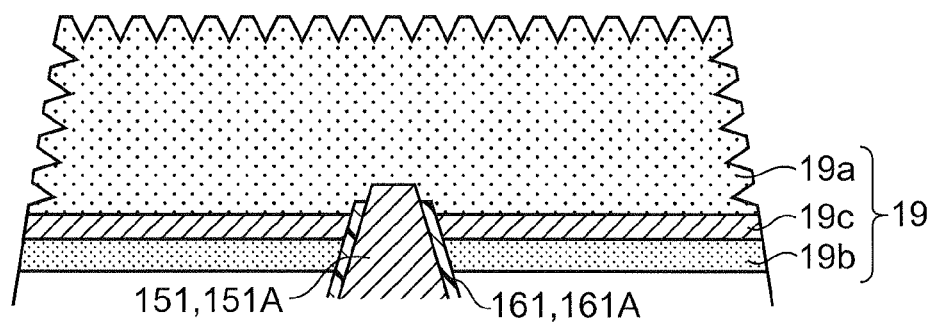
FIGS. 25A and 25B are schematic views for describing a third variation of the semiconductor light emitting element according to the embodiments of the present invention.

Alternatively, in the semiconductor light emitting elements 2 and 3, the side faces of the semiconductor laminate 19 may have projections and depressions in the vertical direction as illustrated in FIG. 25A in addition to the upper faces of the semiconductor laminate 19. Specifically, in the semiconductor light emitting elements 2 and 3 of FIG. 25A, the projections and depressions are alternately formed on the side faces of the semiconductor laminate 19 in the vertical direction. In the semiconductor light emitting element 2 of this case, the textured side faces of the semiconductor laminate 19 diffuse the light emerging from the active layer 19c better before going out, which results in further improved light extraction efficiency. In FIG. 25A, the second protection film 21 of the semiconductor light emitting elements 2 and 3 is not shown (see FIGS. 13 and 18).

Figure 25B:
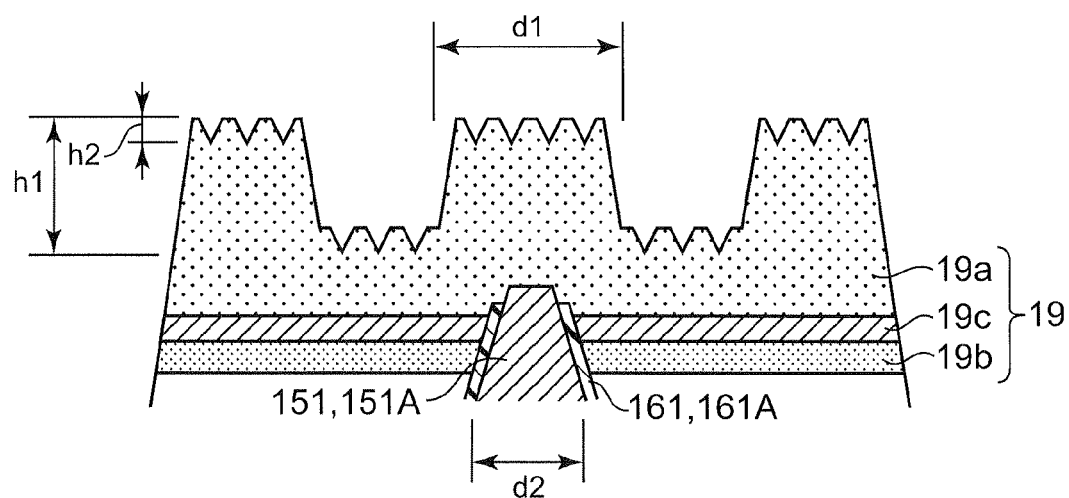

In the above-mentioned semiconductor light emitting elements 2 and 3, the projections and depressions on the upper face of the first semiconductor layer 19a has the same height or depth as illustrated in FIGS. 13 and 18. However, as illustrated in FIG. 25B for example, the first semiconductor layer 19a may have projections and depressions that are composed of a combination of large projections and depressions having a vertical interval h1 and small projections and depressions having a vertical interval h2. In the semiconductor light emitting elements 2 and 3 of this case, the surface diffuses the light emerging from the active layer 19c in wider directions, which results in further improved light extraction efficiency.

In order not to interrupt diffusion of electric current, if the first semiconductor layer 19a has the projections and depressions as illustrated in FIG. 25B, it is preferred that the protrusions 151 or 151A of the first electrode 15 or 15A and the projected openings 161 or 161A of the insulation film 16 or 16A are positioned along with the large projections having the vertical interval h1 as illustrated in the figure, and it is also preferred that the width d2 of the protrusions 151 or 151A of the first electrode 15 or 15A is shorter than the width d1 of the large projections and depressions having the vertical interval h1.

Figure 26:
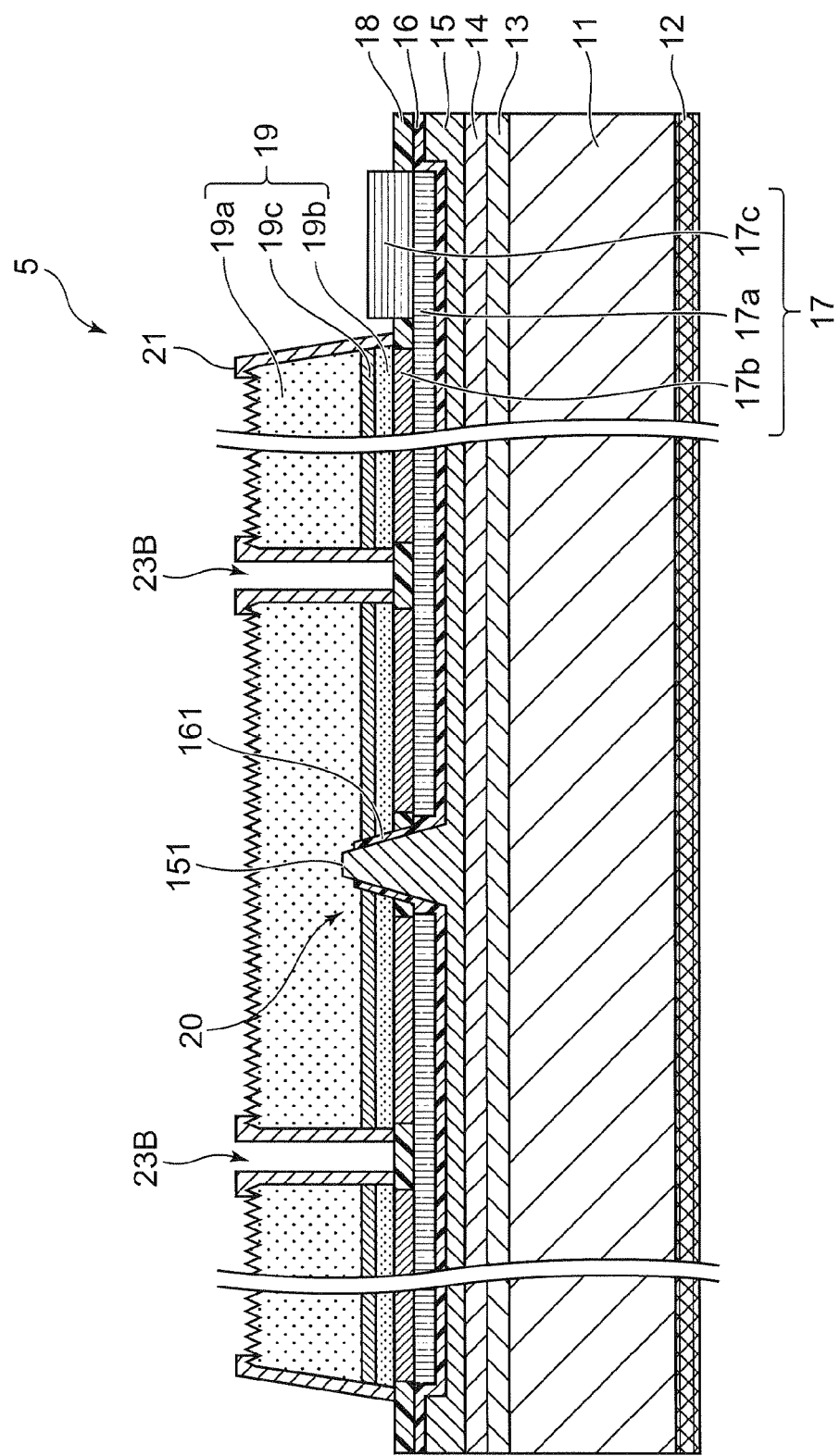
FIG. 26 is a schematic view for describing a fourth variation of the semiconductor light emitting element according to the embodiments of the present invention.
Figure 27:
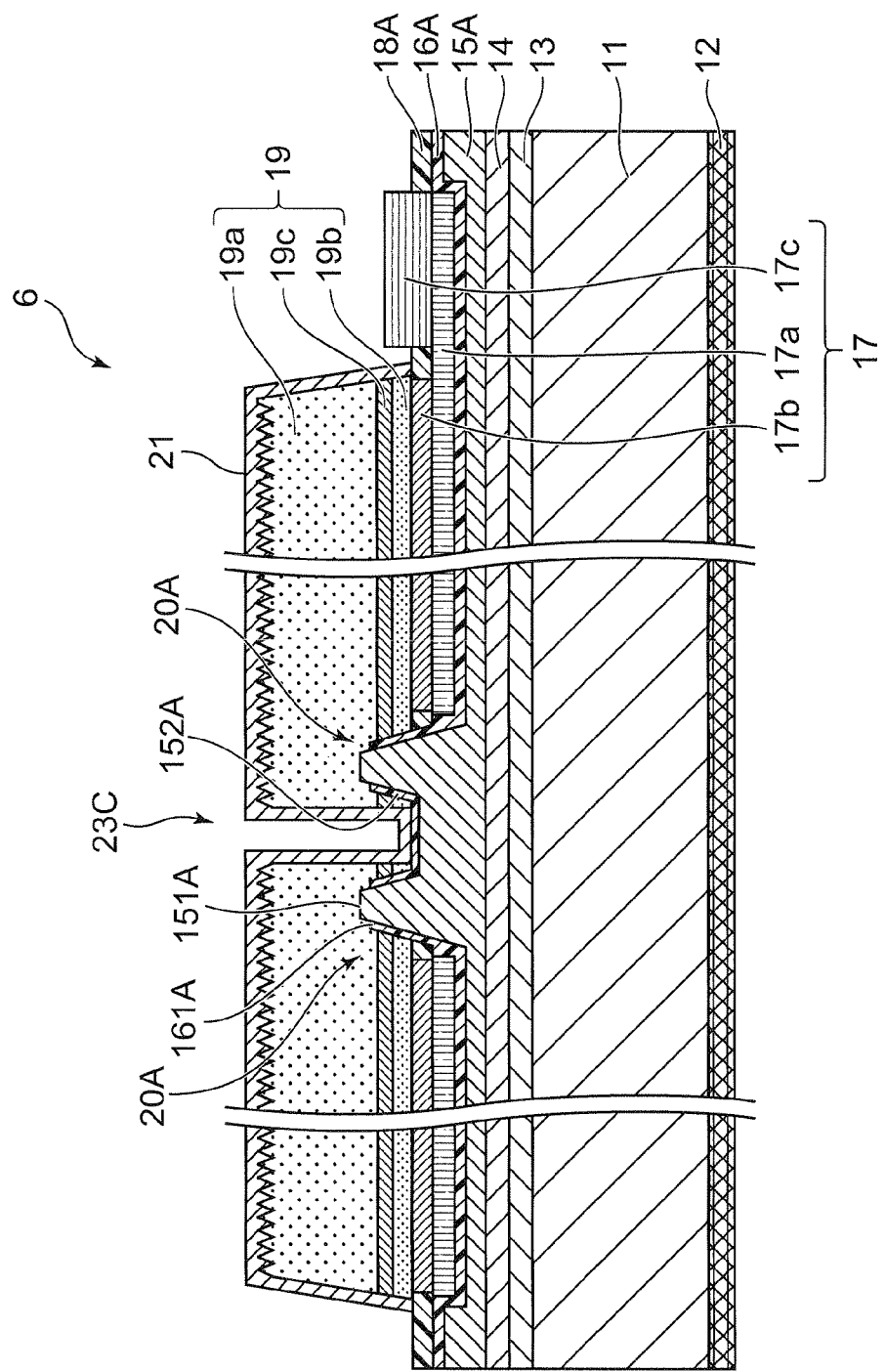
FIG. 27 is a schematic view for describing a fifth variation of the semiconductor light emitting element according to the embodiments of the present invention.

In the above-mentioned semiconductor light emitting elements 2 and 3, the inner circumferential faces of the holes 23 or 23A are inclined in a tapered shape as illustrated in FIGS. 13 and 18. However, as illustrated in FIGS. 26 and 27 for example, they may not be inclined in a tapered shape. That is, in a semiconductor light emitting element 5 of this variation, the inner circumferential faces of holes 23B stand vertically, and the holes 23B have a constant diameter in the vertical direction as illustrated in FIG. 26. Further, in a semiconductor light emitting element 6 of another variation, the inner circumferential faces of the holes 23C stand vertically, and the holes 23C have a constant diameter in the vertical direction as illustrated in FIG. 27. As with the above-mentioned semiconductor light emitting elements 1, 3 and 4, in the semiconductor light emitting elements 5 and 6, this allows the light emerging from an active layer 19c to be easily emitted from the holes 23B or 23C comparing to an semiconductor laminate 19 that is not provided with the holes 23B or 23C, which results in improved light extraction efficiency.

Figure 28:
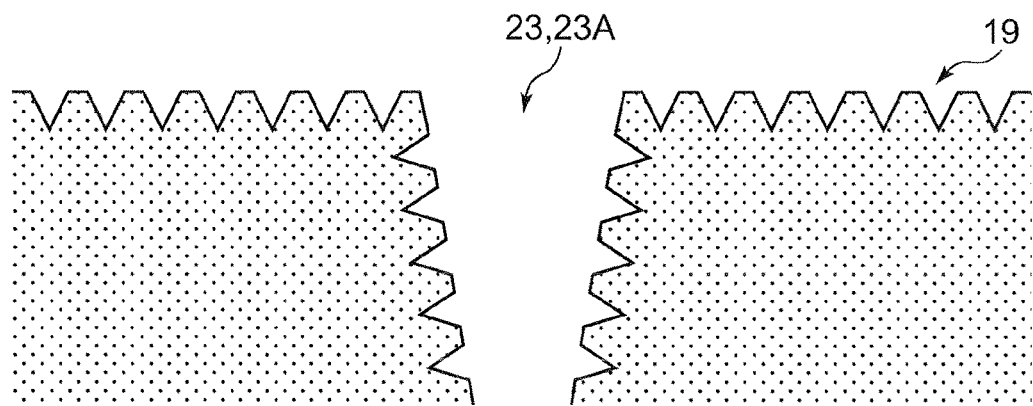
FIG. 28 is a schematic view for describing a sixth variation of the semiconductor light emitting element according to the embodiments of the present invention.

In the above-mentioned semiconductor light emitting elements 2 and 3, the inner circumferential faces of the holes 23 or 23A do not have projections and depressions as illustrated in FIGS. 13 and 18. However, as illustrated in FIG. 28 for example, the inner circumferential faces of the holes 23 or 23A may have projections and depression having a predetermined depth. In the semiconductor light emitting elements 2 and 3 of this case, this projections and depressions further diffuse the light emerging from the active layer 19c, which results in further improved light extraction efficiency. Such projections and depressions may be provided on the vertical inner circumferential faces of the holes 23B or 23C of the above-mentioned semiconductor light emitting elements 5 and 6 (see FIGS. 26 and 27).

What is claimed is:

1. A semiconductor light emitting element comprising:
a substrate;
a semiconductor laminate placed above the substrate, the semiconductor laminate comprising a second semiconductor layer, an active layer and a first semiconductor layer laminated in this order from the substrate; and
a first electrode and a second electrode placed between the substrate and the semiconductor laminate,
wherein the semiconductor laminate comprises a hole that penetrates the first semiconductor layer, the active layer and the second semiconductor layer,
wherein the first electrode comprises a protrusion that penetrates the second semiconductor layer and the active layer to be connected to the first semiconductor layer,
wherein the semiconductor laminate comprises two or more of the holes,
wherein the first electrode comprises two or more of the protrusions, and
wherein the holes and the protrusions are alternately arranged in columns and rows above the substrate.

2. The light emitting element according to claim 1, wherein the first electrode comprises two or more of the protrusions, and wherein the hole is placed on a line connecting two protrusions.

3. The light emitting element according to claim 2, wherein the hole is placed at a substantially same distance from the protrusions.

4. The light emitting element according to claim 1, wherein side faces of the semiconductor laminate and inner circumferential faces of the holes are inclined in a tapered shape.

5. The light emitting element according to claim 1, wherein side faces of the semiconductor laminate and inner circumferential faces of the holes have projections and depressions.

6. The light emitting element according to claim 1, wherein a light reflector is provided on a bottom of each of the holes.

7. The light emitting element according to claim 1, wherein the holes have a round shape or a polygonal shape.

8. The light emitting element according to claim 1, wherein the second electrode has an external connector that is exposed on the bottom of a groove, and wherein the holes are placed around the external connector.

9. The light emitting element according to claim 1, wherein an external connector is exposed at at least one end portion of the bottom of a groove.

10. A semiconductor light emitting element comprising:
a substrate;
a semiconductor laminate placed above the substrate, the semiconductor laminate comprising a second semiconductor layer, an active layer and a first semiconductor layer laminated in this order from the substrate; and
a first electrode and a second electrode placed between the substrate and the semiconductor laminate,
wherein the semiconductor laminate comprises a hole that penetrates the first semiconductor layer, the active layer and the second semiconductor layer,
wherein the first electrode comprises a protrusion that penetrates the second semiconductor layer and the active layer to be connected to the first semiconductor layer,
wherein the semiconductor laminate comprises two or more of the holes,
wherein the first electrode comprises two or more of the protrusions, and
wherein the holes and protrusions are alternately aligned in the diagonal directions above the substrate.

11. The light emitting element according to claim 10, wherein the first electrode comprises two or more of the protrusions, and wherein the hole is placed on a line connecting two protrusions.

12. The light emitting element according to claim 11, wherein the hole is placed at a substantially same distance from the protrusions.

13. The light emitting element according to claim 10, wherein side faces of the semiconductor laminate and inner circumferential faces of the holes are inclined in a tapered shape.

14. The light emitting element according to claim 10, wherein side faces of the semiconductor laminate and inner circumferential faces of the holes have projections and depressions.

15. The light emitting element according to claim 10, wherein a light reflector is provided on a bottom of each of the holes.

16. The light emitting element according to claim 10, wherein the holes have a round shape or a polygonal shape.

17. The light emitting element according to claim 10, wherein the second electrode has an external connector that is exposed on the bottom of a groove, and wherein the holes are placed around the external connector.

18. The light emitting element according to claim 10, wherein an external connector is exposed at at least one end portion of the bottom of a groove.

19. A semiconductor light emitting element comprising:
a substrate;
a semiconductor laminate placed above the substrate, the semiconductor laminate comprising a second semiconductor layer, an active layer and a first semiconductor layer laminated in this order from the substrate; and
a first electrode and a second electrode placed between the substrate and the semiconductor laminate,
wherein the semiconductor laminate comprises a hole that penetrates the first semiconductor layer, the active layer and the second semiconductor layer,
wherein the first electrode comprises a protrusion that penetrates the second semiconductor layer and the active layer to be connected to the first semiconductor layer,
wherein the semiconductor laminate comprises two or more of the holes,
wherein the first electrode comprises two or more of the protrusions,
wherein the holes and the protrusions are provided at the same positions in a plan view,
wherein recesses are formed at the center of the protrusions, and
wherein the bottoms of the holes are located inside the respective recesses.

20. The light emitting element according to claim 19, wherein the first electrode comprises two or more of the protrusions, and wherein the hole is placed on a line connecting two protrusions.

21. The light emitting element according to claim 20, wherein the hole is placed at a substantially same distance from the protrusions.

22. The light emitting element according to claim 19, wherein side faces of the semiconductor laminate and inner circumferential faces of the holes are inclined in a tapered shape.

23. The light emitting element according to claim 19, wherein side faces of the semiconductor laminate and inner circumferential faces of the holes have projections and depressions.

24. The light emitting element according to claim 19, wherein a light reflector is provided on a bottom of each of the holes.

25. The light emitting element according to claim 19, wherein the holes have a round shape or a polygonal shape.

26. The light emitting element according to claim 19, wherein the second electrode has an external connector that is exposed on the bottom of a groove, and wherein the holes are placed around the external connector.

27. The light emitting element according to claim 19, wherein an external connector is exposed at at least one end portion of the bottom of a groove.

* * * * *